United States Patent
Fisch et al.

(10) Patent No.: US 9,812,185 B2
(45) Date of Patent: Nov. 7, 2017

(54) DRAM ADJACENT ROW DISTURB MITIGATION

(71) Applicant: Invensas Corporation, San Jose, CA (US)

(72) Inventors: David Edward Fisch, Pleasanton, CA (US); William C. Plants, Campbell, CA (US)

(73) Assignee: Invensas Corporation, San Jose, CA (US)

(*) Notice: Subject to any disclaimer, the term of this patent is extended or adjusted under 35 U.S.C. 154(b) by 0 days.

(21) Appl. No.: 15/019,788

(22) Filed: Feb. 9, 2016

(65) Prior Publication Data
US 2017/0117030 A1    Apr. 27, 2017

Related U.S. Application Data

(60) Provisional application No. 62/244,494, filed on Oct. 21, 2015.

(51) Int. Cl.
*G11C 11/406* (2006.01)
*G11C 11/408* (2006.01)

(52) U.S. Cl.
CPC ........ *G11C 11/406* (2013.01); *G11C 11/4087* (2013.01)

(58) Field of Classification Search
CPC ............................ G11C 11/406; G11C 11/4087
USPC .............. 365/49.1, 185.08, 222, 236, 230.03
See application file for complete search history.

(56) References Cited

U.S. PATENT DOCUMENTS

| | | | |
|---|---|---|---|
| 8,938,573 B2 | 1/2015 | Greenfield et al. | |
| 8,953,403 B1* | 2/2015 | Song | G11C 11/40618 365/222 |
| 9,030,903 B2* | 5/2015 | Bains | G11C 16/00 365/222 |
| 9,032,141 B2* | 5/2015 | Bains | G11C 11/4078 711/106 |
| 9,117,544 B2 | 8/2015 | Bains et al. | |
| 9,214,216 B2* | 12/2015 | Kim | G11C 11/406 |
| 9,236,110 B2 | 1/2016 | Bains et al. | |
| 9,286,964 B2* | 3/2016 | Halbert | G11C 11/40603 |
| 9,299,400 B2 | 3/2016 | Bains et al. | |
| 9,318,185 B2* | 4/2016 | Kim | G11C 11/40615 |
| 9,685,218 B2* | 6/2017 | Sohn | G11C 11/406 |

(Continued)

OTHER PUBLICATIONS

Aichinger, Barbara P., "DDR Memory Errors Caused by Row Hammer," FuturePlus Systems Corporation, date unknown, 31 pages.

(Continued)

*Primary Examiner* — Vu Le
*Assistant Examiner* — Sung Cho

(57) ABSTRACT

The invention pertains to data disturb vulnerabilities in Dynamic Random Access Memory (DRAM) integrated circuits. In particular, it pertains to mitigating attacks on a computational system by deliberate inducement of disturbs on a targeted row (also known as "row hammering") in the system's DRAM memory. The stream of row addresses accompanying ACTIVE commands is monitored and filtered to only track addresses that occur at a dangerous rate and reject addresses that occur at less than a dangerous rate. When a tracked address poses a danger of causing a memory disturb, each row adjacent to the tracked address row is refreshed thus mitigating the danger.

20 Claims, 15 Drawing Sheets

(56) References Cited

U.S. PATENT DOCUMENTS

| | | | |
|---|---|---|---|
| 2014/0059287 A1* | 2/2014 | Bains | G11C 11/40615 711/106 |
| 2014/0078845 A1* | 3/2014 | Song | G11C 7/02 365/222 |
| 2014/0085995 A1* | 3/2014 | Greenfield | G11C 7/24 365/201 |
| 2014/0095780 A1* | 4/2014 | Bains | G11C 11/406 711/105 |
| 2014/0156923 A1* | 6/2014 | Bains | G11C 11/4078 711/106 |
| 2014/0189228 A1* | 7/2014 | Greenfield | G11C 11/40607 711/106 |
| 2014/0219043 A1* | 8/2014 | Jones | G11C 8/10 365/230.06 |
| 2015/0003180 A1* | 1/2015 | Kim | G11C 11/406 365/222 |
| 2015/0055420 A1* | 2/2015 | Bell | G11C 7/1012 365/189.02 |
| 2015/0058549 A1* | 2/2015 | Jeffrey | G11C 7/02 711/106 |
| 2015/0063049 A1* | 3/2015 | Yang | G11C 11/406 365/222 |
| 2015/0089183 A1 | 3/2015 | Bains et al. | |
| 2015/0109871 A1* | 4/2015 | Bains | G06F 13/1636 365/222 |
| 2015/0155030 A1* | 6/2015 | Song | G11C 11/40618 365/222 |
| 2015/0200002 A1 | 7/2015 | Lin et al. | |
| 2015/0206558 A1* | 7/2015 | Ni | G11C 11/408 711/106 |
| 2015/0213872 A1* | 7/2015 | Mazumder | G11C 11/408 365/218 |
| 2015/0221358 A1* | 8/2015 | Brandl | G11C 11/4087 365/222 |
| 2015/0243345 A1* | 8/2015 | Kim | G11C 11/4082 365/189.05 |
| 2015/0279441 A1* | 10/2015 | Greenberg | G11C 11/406 365/49.1 |
| 2015/0380073 A1* | 12/2015 | Joo | G11C 11/406 365/189.05 |
| 2016/0005452 A1* | 1/2016 | Bae | G11C 29/24 714/764 |
| 2016/0085691 A1* | 3/2016 | Benedict | G06F 12/0806 711/136 |
| 2016/0086649 A1* | 3/2016 | Hong | G11C 11/406 365/96 |
| 2016/0202926 A1* | 7/2016 | Benedict | G11C 11/408 711/106 |
| 2016/0225435 A1* | 8/2016 | Lee | G11C 11/40626 |

OTHER PUBLICATIONS

JEDEC Standard, "DDR4 SDRAM, JESD79-4," white paper, JEDEC Solid State Technology Association, Sep. 2012, 214 pages.

JEDEC Standard, Low Power Double Data Rate 4 (LPDDR4), JESD209-4, white paper, JEDEC Solid State Technology Association, Aug. 2014, 196 pages.

Kim, Yoongu et al., "Flipping Bits in Memory Without Accessing Them: An Experimental Study of DRAM Disturbance Errors," Carnegie Mellon University and Intel Labs, IEEE 2014, 12 pages.

Lee, Jung-Bae, "Green Memory Solution," Samsung Electronics, Investor's Forum 2014, 25 pages.

Micron, DDR4 SDRAM, 4Gb: x4, x8, x16 DDR4 SDRAM Features, white paper, Micron Technology, Inc. 2014, 332 pages.

SK Hynix, "DDR4 SDRAM Device Operation," date unknown, 261 pages.

International Search Report and Written Opinion for PCT Application No. PCT/US2016/057361 dated Jan. 23, 2017.

* cited by examiner

Equation 202  Assume $t_{RC}$ = 44.5 ns (Micron datasheet: DDR4-3200 Speed Bin)

Equation 204  $t_{REFI}$ = 7.8 us (for 0-85°C) = 64 ms / 8,192 rows (or groups of rows)

Equation 206  $N_{HAMMER(max)}$ = 64 ms / $t_{RC(min)}$ = 64 ms / 44.5 ns = 1.44e+6

Equation 208  Assume $N_{WC(min)}$ = 200,000 (value from Micron datasheet TRR specification)

Equation 210  Design Goal: Assume $N_{WC}$ = 100,000 (50% of $N_{WC(min)}$ due to double hammering)

Equation 212  $N_{TRR(max)}$ = $N_{HAMMER(max)}$ / $N_{WC}$ = 1.44e+6 / 1.00e+5 = 14.4 → 15

Equation 214  $R_{OVERHEAD}$ = (8,192 + 30) / 8,192 = 1.004

Figure 2

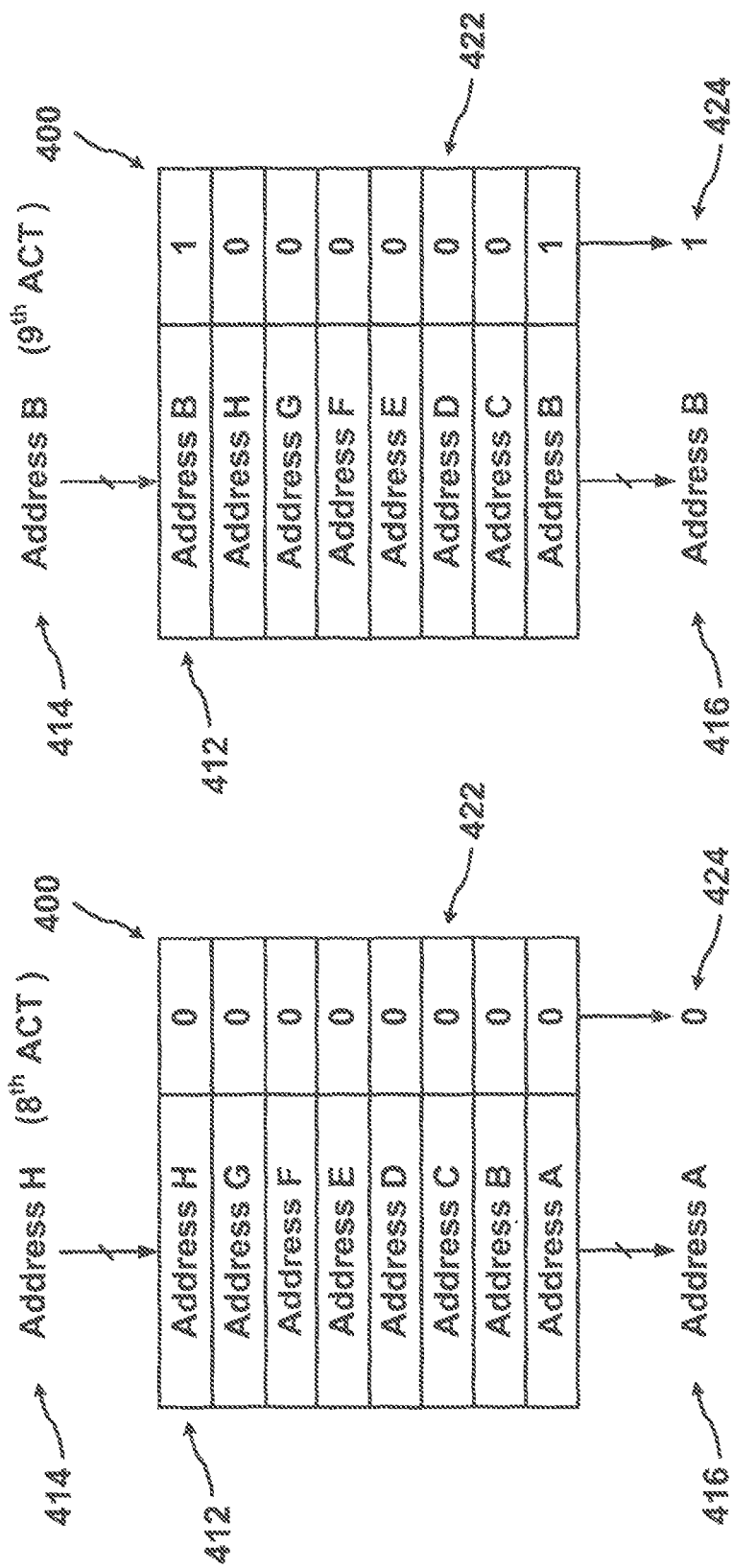

Figure 6A

| | | |
|---|---|---|
| PARA H | 1 | 1 |
| PARA G | 1 | 2 |
| PARA F | 1 | 3 |
| PARA E | 1 | 4 |
| PARA D | 1 | 5 |
| PARA C | 1 | 6 |
| PARA B | 1 | 7 |
| PARA A | 1 | 8 |

PARA H (x 1)
PARA A (x 1)

Figure 6B

| | | |
|---|---|---|
| PARA H | 1 | 10,001 |
| PARA G | 1 | 10,002 |
| PARA F | 1 | 10,003 |
| PARA E | 1 | 10,004 |
| PARA D | 10,001 | 10,005 |
| PARA C | 1 | 10,006 |
| PARA B | 1 | 10,007 |
| PARA A | 1 | 10,008 |

PARA D (x 10,000)

PARA A (x 2,000)
PARA B (x 5,000)
PARA C (x 3,000) ← 608

| | | |
|---|---|---|
| PARA H | 1 | 20,001 |
| PARA G | 1 | 20,002 |
| PARA F | 1 | 20,003 |
| PARA E | 1 | 20,004 |
| PARA D | 10,001 | 20,005 |
| PARA C | 3,001 | 20,006 |
| PARA B | 5,001 | 20,007 |
| PARA A | 2,001 | 20,008 |

Figure 6C

PARA E (x 1)
PARA G (x 1)
PARA H (x 1) ← 608

| | | |
|---|---|---|
| PARA H | 2 | 20,004 |
| PARA G | 2 | 20,005 |
| PARA F | 1 | 20,006 |
| PARA E | 2 | 20,007 |
| PARA D | 10,001 | 20,008 |
| PARA C | 3,001 | 20,009 |
| PARA B | 5,001 | 20,010 |
| PARA A | 2,001 | 20,011 |

PARA J (x 1) → 608

600

| | | | |
|---|---|---|---|
| PARA H | 2 | 20,005 | |
| PARA G | 2 | 20,006 | |
| PARA J | 1 | 1 | |
| PARA E | 2 | 20,008 | |
| PARA D | 10,001 | 20,009 | |
| PARA C | 3,001 | 20,010 | |
| PARA B | 5,001 | 20,011 | |
| PARA A | 2,001 | 20,012 | |

PARA K (x 1)
PARA L (x 1)
PARA M (x 1) → 608

600

| | | | |
|---|---|---|---|
| PARA M | 1 | 1 | |
| PARA L | 1 | 2 | |
| PARA J | 1 | 4 | |
| PARA K | 1 | 3 | |
| PARA D | 10,001 | 20,012 | |
| PARA C | 3,001 | 20,013 | |
| PARA B | 5,001 | 20,014 | |
| PARA A | 2,001 | 20,015 | |

620-1 → 620-2 → 620-3 → 620-4 → 620-5 → 620-6 → 620-7 → 620-8 →

606    668    670
664

Figure 6G — $N_{TENURE(min)} = 4$

PARA P (x 1) 608, 600

| | 606 | 668 | 670 |
|---|---|---|---|
| 620-1 → | PARA M | 1 | 2 |
| 620-2 → | PARA L | 1 | 3 |
| 620-3 → | PARA J | 1 | 5 |
| 620-4 → | PARA K | 1 | 4 |
| 620-5 → | PARA D | 10,001 | 20,013 |
| 620-6 → | PARA C | 3,001 | 20,014 |
| 620-7 → | PARA B | 5,001 | 20,015 |
| 620-8 → | PARA P | 1 | 1 |

664

Figure 6H — $N_{TENURE(min)} = 3$

PARA P (x 1) 608, 600

| | 606 | 668 | 670 |
|---|---|---|---|
| 620-1 → | PARA M | 1 | 2 |
| 620-2 → | PARA L | 1 | 3 |
| 620-3 → | PARA P | 1 | 1 |
| 620-4 → | PARA K | 1 | 4 |
| 620-5 → | PARA D | 10,001 | 20,013 |
| 620-6 → | PARA C | 3,001 | 20,014 |
| 620-7 → | PARA B | 5,001 | 20,015 |
| 620-8 → | PARA A | 2,001 | 20,016 |

664

DRAM ADJACENT ROW DISTURB MITIGATION

RELATED APPLICATIONS

This application claims priority to U.S. provisional patent application 62/244,494 filed on Oct. 21, 2015 which is hereby included by reference herein in its entirety.

FIELD OF THE INVENTION

The invention pertains to data disturb vulnerabilities in Dynamic Random Access Memory (DRAM) integrated circuits. In particular, it pertains to mitigating attacks on a computational system by deliberate inducement of row disturbs (also known as "row hammering") in the system's DRAM memory.

BACKGROUND OF THE INVENTION

In memory technology, a "disturb" refers to data loss in one or more memory cells in a memory array. This can result from many causes ranging from environmental factors such as, for example, radiation by alpha particles or other ionized atoms and power supply glitches. They can also occur from operations on one or more other memory cells in the same array. Disturbs can occur in most memories. Failure mechanisms can vary from technology to technology (e.g., DRAM, SRAM, Flash, etc.) and can differ between different manufacturers and even between process generations in the same technology from the same manufacturer.

One of the characteristics of DRAM technology is that data is stored by capturing a quantity of charge on a capacitor in each memory cell. Accessing a memory cell is destructive, meaning that the data in all the cells in a row must be read and then rewritten to the cells in order to restore the charge level to its original condition before de-accessing the row. Thus a read access is effectively a read-restore operation and a write operation is effectively a read-modify-restore operation.

In most applications a DRAM controller is used to manage the complexities of DRAM operation details. If a row of memory cells is not accessed periodically in the course of operation, the charge in the memory cells can leak away resulting in data loss. The DRAM controller is responsible for managing this by issuing refresh (REF) commands to the DRAM with sufficient frequency that each memory cell undergoes a read-restore operation at least once during the specified refresh cycle.

In recent generations of DRAM devices, a disturb mechanism known as row hammering has been discovered that can be exploited by malicious persons who attempt infiltrate a computer system and gain access and/or control (hereafter "attackers" and often colloquially known as "hackers"). This vulnerability results from smaller, more densely packed memory cells in current generation DRAMs. Since the word lines are physically closer than in previous generations, the capacitive coupling between adjacent word lines is increased. Repeated activation of a word line (the "target row") induces repeated partial activation on the two adjacent word lines (the "victim rows"). This in turn leads to charge loss from the cells on the victim rows which can result in some cells losing their data prior to the next refresh of that row. A variation of this known as "double hammering" is an attack in which two target rows on either side of a single victim row is repeatedly accessed causing disturbs more quickly.

DRAM integrated circuits are typically organized into banks which allows commands to be directed to different banks at different times substantially in parallel allowing multiple simultaneous operations to be performed in different parts of the memory. Typically, to perform an access operation (read or write) on a bank, a row is activated (or "opened") by issuing a row activate command (ACT) for that bank and specifying a particular row address in that bank. This allows a succession of read and/or write operations to be performed at memory column addresses located on that row. When an access to a row is complete, the row must be deactivated (or "closed"—also known as pre-charging) by issuing a pre-charge command (PRE) to that bank or by issuing a pre-charge all command (PREA) to all banks at once.

Row hammering may involve issuing repeated pairs of an ACT command and a read with auto pre-charge command (RDA) to a particular target row (or rows) attempting to alter the data in one of the adjacent victim rows. The RDA command executes a combination of a normal read command (RD) with an immediately following pre-charge (an "auto pre-charge") for that row. This may be the fastest way to execute a row hammer attack without being obvious (and thus easily detectable), since a series of ACT and immediate PRE commands without read or write operations would serve no legitimate purpose.

This is an effective attack method because typically one or more memory pages (usually four kilobytes in modern systems) can be stored into a single row allowing the processor to access one or more entire pages at a time. Thus row disturbs caused by accessing a particular page will occur in a completely different memory page—and therein lies the problem.

In most modern operating systems (OS), main memory is typically virtualized. This means each page has a "physical address" corresponding to the physical location in the DRAM and a "virtual address" which is what the operating system and user applications manipulate to emulate larger contiguous memory spaces. The OS maintains a "page table" which keeps track of the translations between each virtual page and its physical counterpart. Each page in the memory has a data record in the page table known as a page table entry (PTE). Since PTEs are also stored in main memory they are vulnerable to row hammering attacks.

Typically, different pages have different levels of privilege (e.g., the user security level required to access that page). Thus an attacker can launch a non-privileged application running a row hammering attack which can in turn corrupt data in memory locations where it does not have any access privileges. These locations may belong to another application or to even the operating system itself. This creates a security violation. Once the violation occurs, the attacker can use a variety of techniques beyond the scope of this disclosure to gain access to and/or control of the system.

A recent paper based on research conducted jointly by Carnegie Mellon University and Intel Corporation entitled *Flipping Bits in Memory Without Accessing Them: An Experimental Study of DRAM Disturbance Errors*, by Yoongu Kim, et al, IEEE $41^{st}$ International Symposium on Computer Architecture, June 2014 (henceforth Kim)—which is hereby included by reference herein in its entirety—analyzed the problem and suggested seven possible solutions: [1] make better memory chips, [2] correct errors with error correction coding (ECC), [3] refresh more frequently, [4] retire weak cells (by the manufacturer), [5] retire weak cells (by the end user), [6] identify target rows and refresh their neighbors, and their proposed solution [7] probabilistic adjacent row activation.

Kim solution [3], increasing the refresh rate, is the current conventional approach. In most current generation systems, doubling the refresh rate will eliminate the problem by insuring each row gets refreshed before a row hammer attack can do sufficient damage to cell charge to cause errors. While this has the virtue of simplicity, it requires an increase in system power which is undesirable in data center applications (due to the high power density) and in battery operated devices such as cellphones, tablets, and laptop computers (where long battery life is a major selling point). It also detracts from system performance since additional refresh cycles reduce memory system bandwidth.

Kim solution [1] is to design better memories. The major DRAM manufacturers have attempted to improve their memory designs, with some success. For example, the JEDEC LPDDR4 (Low Power Double Data Rate 4) SDRAM Standard, JESD209-4, August 2014 (henceforth JEDEC LPDDR4)—which is hereby included by reference herein in its entirety includes an optional feature called Target Row Refresh (TRR). If TRR is implemented, the LPDDR4 part is tested by the manufacturer to determine the Maximum Activate Count (MAC) for that particular part—the MAC being the number of repeated ACT and PRE (or PREA or RDA) commands between refresh cycles that can be tolerated in a single row before row hammering can cause a memory disturb.

The memory controller or operating system must track the number of row activations that have been issued to each row to determine if the MAC limit has been reached. Then the part must be put into its idle state (by pre-charging all banks) before entering TRR mode to perform three successive refreshes to the target row and its two adjacent neighbors. Since the memory controller only knows the target row, the SDRAM on-chip TRR circuit assists by internally identifying the two victim rows and handles their addressing for the controller. This places a substantial burden on the memory controller and/or the operating system software, thereby adding significant complexity to designing a secure system.

Although TRR is not a part of the JEDEC DDR4 (Double Data Rate 4) SDRAM Standard, JESD79-4, September 2012 (henceforth JEDEC DDR4)—which is hereby included by reference herein in its entirety—the major DRAM manufacturers have incorporated a TRR implementation into their most recent DDR4 offerings.

For example, Micron Technology offers a TRR circuit in their DDR4 parts which is similar (but not identical) to the LPDDR4 feature. Micron claims that while the circuitry is there, it is not usually needed since the majority of tested parts have no vulnerability. Unfortunately, most-but-not-all of the time leaves the system designer needing to deal with the not-all case which, in practice, is akin to the LPDDR4 solution.

SK Hynix also offers a TRR circuit on its recent DDR4 products similar (but not identical) to both the LPDDR4 and Micron solutions. This has the same drawbacks. Additionally, since these TRR circuits are not standardized, system designers must now make allowances for which manufacturer their DRAMs are sourced from and include the appropriate algorithms for both.

Samsung has a third solution known as "pseudo-TRR," though the details are not publicly available. Samsung claims that the combination of pseudo-TRR and doubling the refresh rate will solve the row hammering problem, which suggests their answer to the problem is a combination of Kim solutions [1] and [3].

Kim solution [2], using error correction codes (ECC) is expensive and has limitations. Currently ECC is only used in data center and enterprise class memory modules, being too expensive for most consumer systems. ECC SDRAM modules typically use a Hamming single error correction, double error detection (SECDED) code. The Kim study notes that row hammering attacks frequently cause multiple errors in the typical 64-bit DRAM data word and that SECDED is insufficient to mitigate the problem alone. Stronger error correction codes (e.g., Reed-Solomon, binary BHC, etc.) can be used, but they are computationally intensive requiring considerable time, power, additional memory cells (to hold the parity bits for each data word), and silicon area to implement. This makes them undesirable for use in fast system memory applications and expensive for low performance systems.

Another issue with ECC is that in order to correct errors the data must be read out of the DRAM (perhaps during a refresh cycle), decoded, corrected, re-encoded and then written back into the memory cells. This takes longer that a normal refresh cycle and further increases power while decreasing memory bandwidth.

The Kim paper is fairly dismissive of solutions [4] and [5]. It states that solution [4], having the manufacturers retire victim rows before shipping the product, is impractical due to both test time and to the potential number of spare rows needed. Kim also observes that solution [5], having the user retire victim cells, simply throws the same burden on the system designer who has to find and replace bad memory rows performing analogous operations at the system level at significant cost in processing time and available memory.

Kim is also dismissive of solution [6], which is to identify target rows and refresh their neighbors. Since it is impractical to have an access frequency counter for each row in a memory chip, complicated algorithms, searches and approximations must be used, and these can yield many false hits requiring many unnecessary additional refresh cycles.

The Kim advocated solution [7], probabilistic adjacent row activation, has the virtue of simplicity and low overhead but is not without its drawbacks. The approach is to "flip" a biased "coin" after each active and pre-charge pair. Thus randomly (Kim suggests on the order of one in a thousand row activations) one of the two adjacent rows is randomly activated and then pre-charged (the equivalent of a refresh for that row). It may take many thousands of row activations to induce an error (50,000 or more according to Kim, or 200,000 or more according to JEDEC LPDDR4). Thus a row targeted many times may have a high probability that both of the adjacent victims will get refreshed long before the hammering attack succeeds in causing a disturb error, thus resulting in an acceptably low error rate that can be tuned for a particular system.

The downside to probabilistic adjacent row activation, like most of the other solutions, is that it places the burden, albeit lighter than most of the others, on the memory controller and/or software and requires adjacency information that the memory manufacturers typically do not provide and may not be willing to provide in the future. Kim suggests a possible work-around by making educated guesses about adjacency between rows, but this simply increases the overhead required (due to unnecessary refreshes when the educated guesses are wrong) while reducing the quality of the results (since the real victim row may be missed). Also, many engineers prefer to implement deterministic hardware and/or software (and/or may be required to do so by their managers) and may find the non-deterministic nature of probabilistic adjacent row activation to be unacceptable.

Thus it is highly desirable to have a solution to the row hammering problem that is substantially transparent to the memory controller and/or software and handles the issue internally to the DRAM with little overhead and minimal involvement from the memory controller or operating system.

DESCRIPTION OF THE DRAWINGS

FIG. 2 illustrates a calculation in accordance with an embodiment of the present invention.

FIGS. 4A through 4D illustrate the operation of a FIFO CAM in accordance with an embodiment of the present invention.

FIGS. 6A through 6H illustrate the operation of a BBR CAM in accordance with an embodiment of the present invention.

DETAILED DESCRIPTION OF THE INVENTION

Those of ordinary skill in the art will realize that the figures and descriptions of exemplary embodiments and methods of the present invention are illustrative only and not in any way limiting. Other embodiments will readily suggest themselves to such skilled persons after reviewing this disclosure.

Figure 1:
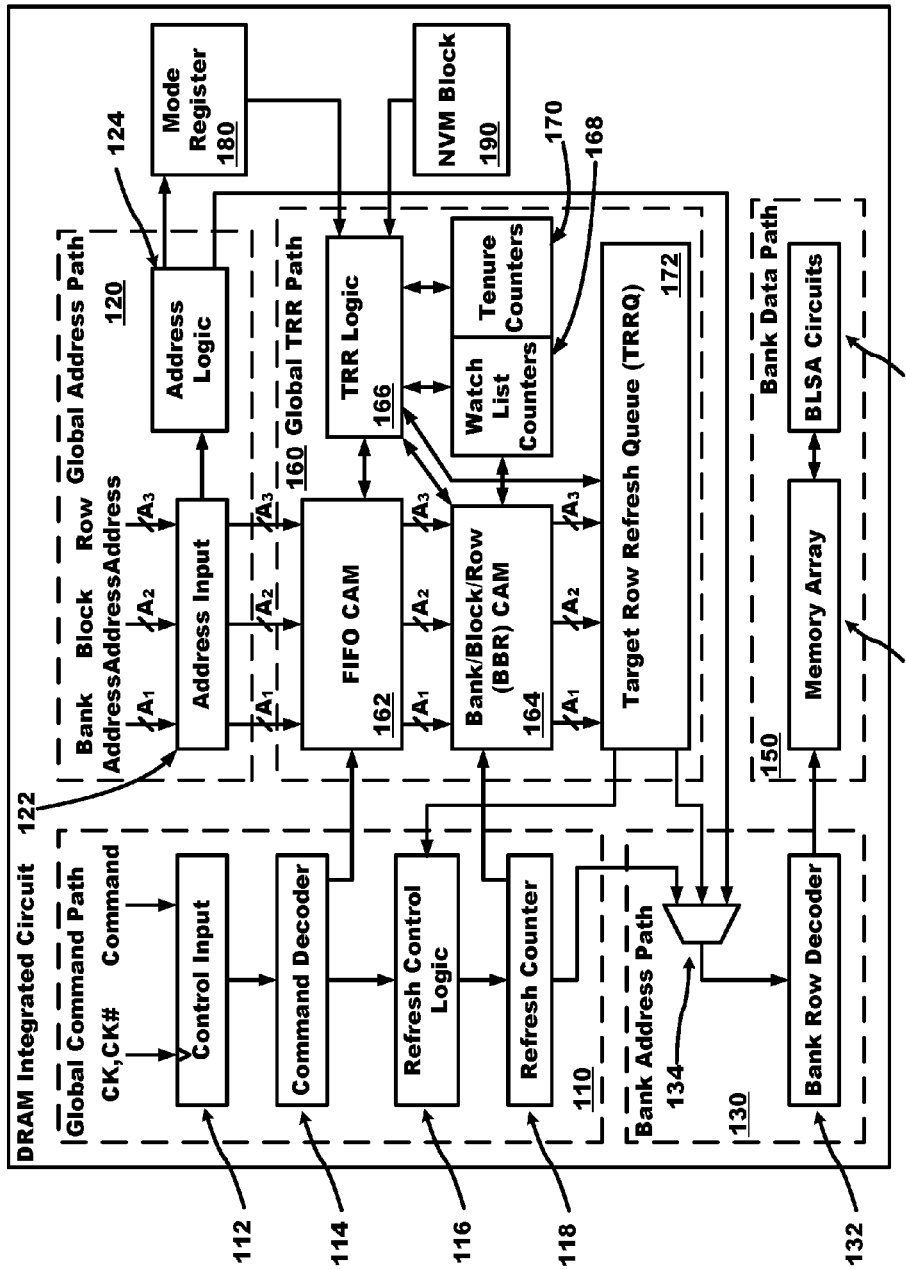
FIG. 1 illustrates a DRAM integrated circuit according to an embodiment of the present invention.

FIG. 1 illustrates a DRAM integrated circuit 100 according to the present invention. DRAM 100 comprises a number of major functional blocks: global command path 110, global address path 120, bank address path 130, bank data path 150, global TRR path 160, mode register 180 and NVM block 190. Persons skilled in the art will appreciate that there are many other circuits on DRAM integrated circuit 100 that are not shown in FIG. 1 like, for example, the global data path, which are omitted to avoid excessively complicating the disclosure.

Note that in DRAM terminology, different groups of circuits are often referred to as a "path" having a particular functionality. This is because all of these "paths" ultimately lead to the array of memory cells where the data is ultimately stored. It is a convenient way of talking about functions that are often located in multiple physical places and at multiple levels of the organizational hierarchy. For example, in FIG. 1 there is a global address path 120 and a bank address path 130. The functional blocks in the global circuitry in each path are typically instantiated only once in the DRAM, while the functional blocks in the bank circuitry will typically be instantiated once per bank.

Returning to FIG. 1, global command path 110 is the command circuitry that processes the clock and command inputs to DRAM 100 and generates the signals necessary to control the other functional blocks. Only a small number of the functional sub-blocks are shown in FIG. 1 to avoid excess complexity. DRAM 100 is a synchronous DRAM (SDRAM) since operations are performed with respect to the differential clock signals CK and CK#. Note that the "#" symbol is used herein to designate signals that are active in the low or logic-0 state and/or logical complements of other signals. Here CK# is the logical complement of CK.

The command input signals are monitored and may be captured on the rising and/or falling clock edges (or transitions) in control input block 112 depending on the design details of DRAM 100. Other signals like, for example, the address inputs for the bank, block and row address signals, may also be captured on the active edge or edges of CK and CK# though many of these signals and connections are not explicitly shown in FIG. 1 to avoid excessive complexity.

Command decoder 114 may accept the captured command input signals from control input 112 and convert them into a variety of internal control signals used for the correct operation of DRAM 100. While connections to the refresh control logic 116 and FIFO CAM 162 are explicitly shown and will be discussed below, many other connections are not shown in FIG. 1 avoid excessive complexity.

Refresh control logic 116 may be controlled by command decoder 114 and in turn may control refresh counter 118. A connection to refresh control logic 116 from target row refresh queue 172 is explicitly shown and will be discussed below.

In general, SDRAM devices such as DRAM 100 cycle through all of the addressable rows in a sequential order determined by the details of the design of refresh counter 118 in response to a regular refresh operation presented to control input 112 and commanded by control decoder 114. Connections from refresh counter 118 to multiplexer 134 and BBR CAM 164 are explicitly shown and will be discussed below. DRAM parts typically comprise multiple banks in which the same row location in each bank is refreshed simultaneously during a normal refresh operation.

Depending on the size of the memory, more than one row location may be refreshed during a single refresh operation. In general, there is agreement industry wide that every row needs to be refreshed an average of once every 64 milliseconds (ms) below 85° C.—or every 32 ms above 85° C. Thus at temperatures less than 85° C. and in parts having 8,192 rows (or groups of rows) to refresh, a refresh command must be issued an average of once every 7.8 microseconds (μs)—or 3.9 ms above 85° C. This is a well-known specification ($t_{REFI}$) present on DRAM data sheets for many generations.

Global address path 120 may monitor and capture the bank, block and row address inputs with respect to CK and CK# in address input 122. Address input 122 then presents the captured addresses to wherever they are needed. In normal operation this is typically address logic 124.

Typically, DRAMs are broken into multiple banks to allow parallel operations to occur substantially simultaneously. The bank address input comprises a number of bits, represented by $A_1$ in FIG. 1. Each bank is typically broken into a number of blocks that are addressed by a separate number of bits represented by $A_2$. Further, each block will typically comprise many rows that are addressed by a third number of bits represented by $A_3$ in the figure.

In most recent generations of SDRAMs, there have been eight banks meaning $A_1=3$. DDR4 is the major exception having 16 banks with $A_1=4$. The values of $A_2$ and $A_3$ vary according to the size of the memory (which relates to the number of memory cells, to the number of blocks, and to their internal organization in terms of rows and columns). Thus $A_2$ and $A_3$ vary from part to part and are typically treated as proprietary information by the manufacturer. An advantage of the present invention is that it provides a superior TRR solution internal to DRAM 100 so that manufactures may maintain these design details as proprietary information.

Returning to FIG. 1, bank address path 130 may be instantiated multiple times in DRAM 100, typically once for each bank. While there are many sub-blocks in bank address path 130, only bank row decoder 132 and multiplexer 134 are shown in the Figure to avoid excessive complexity.

Bank row decoder 132 may be used to translate between the block and row address bits and the actual physical row in the bank to be accessed, while the bank address bits are used to select which bank is selected for the operation. Multiplexer 134 may choose the source of the block and row address bits. For example, for a normal read or write operation the source may be address logic 124, and for a normal refresh operation the source may be refresh counter 118. The case where the source may be the target row refresh queue 172 will be discussed below.

Bank data path 150 may be instantiated multiple times in DRAM 100, at least once in each bank. While there are many sub-blocks in bank address path 150, only memory array 152 and bit line/sense amplifier (BLSA) circuits block 154 are shown in the FIG. 1 to avoid excessive complexity. Memory array 152 comprises the memory cells organized in addressable blocks, addressable rows, and addressable columns where the data is stored and accessed through read, write, and refresh operations. The BLSA circuits are coupled with the addressable columns and provide the analog connection between memory array 152 and the rest of the data path (not shown in FIG. 1) through which the data passes during regular memory accesses. The details of these circuits are well known in the art and need not be described in further detail. The addressable blocks and addressable rows may be uniquely selectable by bank row decoder 132 which may be used to select specific addressable rows for access or refresh operations.

Global target row refresh (TRR) path 160 comprises sub-blocks FIFO CAM 162, BBR CAM 164, TRR Logic 166, watch list counters 168, tenure counters 170, and target row refresh queue 172. In general terms, this block may monitor decoder 114 to detect the arrival of active (ACT) commands and address input 122 to detect the arrival of the associated sequence of active row addresses. Global TRR path 160 provides a two-step filter that monitors the arriving sequence of active row addresses, detects active row addresses that are arriving at a more frequent rate than a predetermined maximum safe rate, tracks the number of occurrences of those detected active row addresses, and requests a special refresh operation for a specific active row address if the number of occurrences of that specific active row address exceeds a predetermined safe maximum number of occurrence. Thus, excessive row activations at a particular address (consistent with the address being a target of a row hammer attack) are protected and less frequently occurring addresses (consistent with the address not being a target of a row hammer attack) are filtered out.

Mode register 180 comprises a number of sub-registers which contain control data for DRAM 100. These are loaded by the memory controller, typically after reading them from the serial presence detect (SPD) device in a dual inline memory module (DIMM) application, or typically by software or firmware in other applications. In most DRAM devices, there are undefined bits or entire undefined registers reserved for future use in the relevant standard. Some of these available bits may be used control various features such as enabling or disabling global TRR path 160 or determining the depth of the various memories such as FIFO CAM 162 and BBR CAM 164.

Mode register 180 is coupled to address logic 124 and the data stored therein is typically loaded via the address inputs. It is also coupled to TRR logic 166 so that the contents of mode register 180 may enable control and/or global TRR path 160. The various control parameters for global TRR path 160 described herein may also be stored in mode register 180. Many of the connections to and from mode register 180 have been omitted from FIG. 1 to avoid over complicating the disclosure.

Non-volatile memory (NVM) block 190 stores a variety of information used in the operation of DRAM 100. For example, many bits in NVM block 190 control test functions that are disabled after testing but before the part is shipped from the manufacturer. Other bits are used to tweak a number of internal design parameters like for example, trimming internal voltage levels from the outputs of internal regulators, trimming the delay values of critical circuits to maximize function and/or yield, or replacing malfunctioning rows and/or columns with redundant ones to turn damaged parts with bad memory bits into fully functional ones, etc. The exact nature of the non-volatile technology used to implement NVM block 190 is well known in the art. Typically, it is implemented with fuses, though any technology that retains data when the power supply is disconnected such as, for example, Flash, EEPROM, blown transistor gate oxide, antifuses, etc., may be used.

The information stored in NVM block 190 is typically defined by the manufacturer and transparent to the user. The various control parameters for global TRR path 160 described herein may also be stored in NVM block 190. In combination, mode register 180 and NVM block 190 may allow both the manufacturer and the end user (if allowed by the manufacturer) to control aspects of the functionality of global TRR path 160.

FIG. 2 illustrates a calculation 200 comprising equations 202 through 214 in accordance with an embodiment of the present invention. In order to assess the row hammer problem for any particular design, some empirical data along with some analysis is required. The calculation 200 is exemplary only and persons skilled in the art will readily appreciate that different assumptions will produce different results for different embodiments of the invention.

The parameter $t_{RC}$ is typically a key SDRAM datasheet parameter known industry wide as the "row cycle time" or sometimes as the ACTIVATE-to-ACTIVATE command period. It may typically be expressed as the sum of two other parameters $t_{RAS}$ (the ACTIVATE-to-PRECHARGE command period) and $t_{RP}$ (the PRECHARGE command period). This value may represent the shortest period that a row may be opened and then closed. Thus the lowest value of $t_{RC}$ may be the worst case condition for a row hammering attack and may determine the number of times a row hammer attack access may be attempted during a refresh cycle.

In equation 202 ($t_{RC}$=44.5 ns), for this exemplary calculation a worst case $t_{RC}$ will be assumed to be 44.5 nanoseconds (ns), which corresponds the shortest $t_{RC}$ (for the fastest speed bin) in the datasheet for the recent Micron Technology 4 gigabyte (Gb) DDR4 offerings: MT40A1G4xx-0xxE, MT40A512M8xx-0xxE, and MT40A256M16GE-0xxE.

Equation 204 ($t_{REFI}$=7.8 μs (for 0-85° C.)=64 ms/8,192 rows) shows the exemplary derivation of $t_{REFI}$=7.8 μs from a 64 ms refresh cycle time and 8,192 refresh cycles as discussed above.

Equation 206 ($N_{HAMMER(max)}$=64 ms/$t_{RC(min)}$=64 ms/44.5 ns=1.44e+6) shows the exemplary derivation of $N_{HAMMER(max)}$ defined as the maximum number of row openings and closings possible in a 64 ms refresh cycle divided by the smallest row access time $t_{RC(min)}$ (assumed to be 44.5 ns here) which yields approximately 1.44e+6 (1.44 million or 1,440,000) row cycle events. Note that for higher temperatures above 85° C. the refresh rate is effectively doubled due to the higher memory cell leakage while $t_{RC}$ remains substantially constant. Thus the 64 ms in the numerator of equation 206 becomes 32 ms above 85° C. meaning the value of $N_{HAMMER(max)}$ is halved, making the value for below 85° C. in equation 206 the worst case.

Equation 208 ($N_{WC(min)}$=200,000 shows the exemplary assumption of $N_{WC(min)}$=200,000 which is the worst case (e.g., the lowest) maximum access count (MAC) (e.g., the number of row accesses or cycles before row hammer damage can occur) from both the Micron DDR4 4 Gb datasheet and the JEDEC LPDDR4 Standard. This is a reasonable value to use for the threshold to design to for the parts most vulnerable to row hammering.

Equation 210 ($N_{WC}$=100,000) expresses an exemplary design goal for an embodiment of the present invention. Since $N_{WC(min)}$ is the number of accesses between refreshes a single row can tolerate, then a double row hammer attack could be performed with two rows each performing half of those accesses. To avoid tracking target row pairs (more involved than just single target rows), it makes sense to use half the worst case MAC so that double row attacks are caught in the same way as single row attacks. Thus for the exemplary calculation it is reasonable to assume $N_{WC}$=100,000 (=1.00e+5). Persons skilled in the art will realize that other assumptions, data, or competing design goals will result different values of $N_{WC}$ in different embodiments.

Equation 212 ($N_{TRR(max)}$=$N_{HAMMER(MAX)}$/$N_{WC}$=1.44e+6/1.00e+5=14.4→15) shows the exemplary derivation of the worst case number of possible row hammer attacks that can occur during a refresh cycle $N_{TRR(max)}$. In this exemplary calculation $N_{TRR(max)}$=15 (14.4 rounded up to the nearest integer) which means that there is only time in a 64 ms refresh cycle for a maximum of 15 row hammer attacks. Persons skilled in the art will appreciate that this calculation is exemplary only, that different assumptions would lead to different results, that other assumptions and factors might be introduced, and that for any specific DRAM embodiment the assumptions used may be different and more appropriate for the that particular case.

Thus in a worst case scenario for the assumptions in the calculations of FIG. 2, only $N_{TRR(max)}$ or 15 target rows need to be monitored during any complete refresh cycle—as long as they are the correct 15 rows. Since a target row is effectively refreshed every time it is accessed, only the adjacent victim rows need special refresh cycles. As derived in exemplary equation 214 ($R_{OVERHEAD}$=(8,192+30)/8,192=1.004), the addition of an additional 30 refresh operations during a complete 8,192 operation refresh cycle is only 0.4% of overhead—a very modest price to pay compared to doubling the refresh rate (100% overhead) as in the conventional solution.

The various parameters calculated in Equations 202 through 214 are predetermined for a particular set of anticipated conditions. It is preferred that once global TRR path 160 is operational that these parameters do not change. If a change is desired, it is best to stop operating DRAM 100, refresh all rows in all banks, change any desired parameters, perform a global reset and then resume operations.

Providing a counter for each row in DRAM 100 to only track rows with high access rates is impractical in terms of silicon die area. Thus a filtering of the stream of row addresses accompanying active (ACT) commands is needed to screen out rows that are not activated frequently enough to need additional refreshing beyond the normal refresh cycle.

Figure 3:
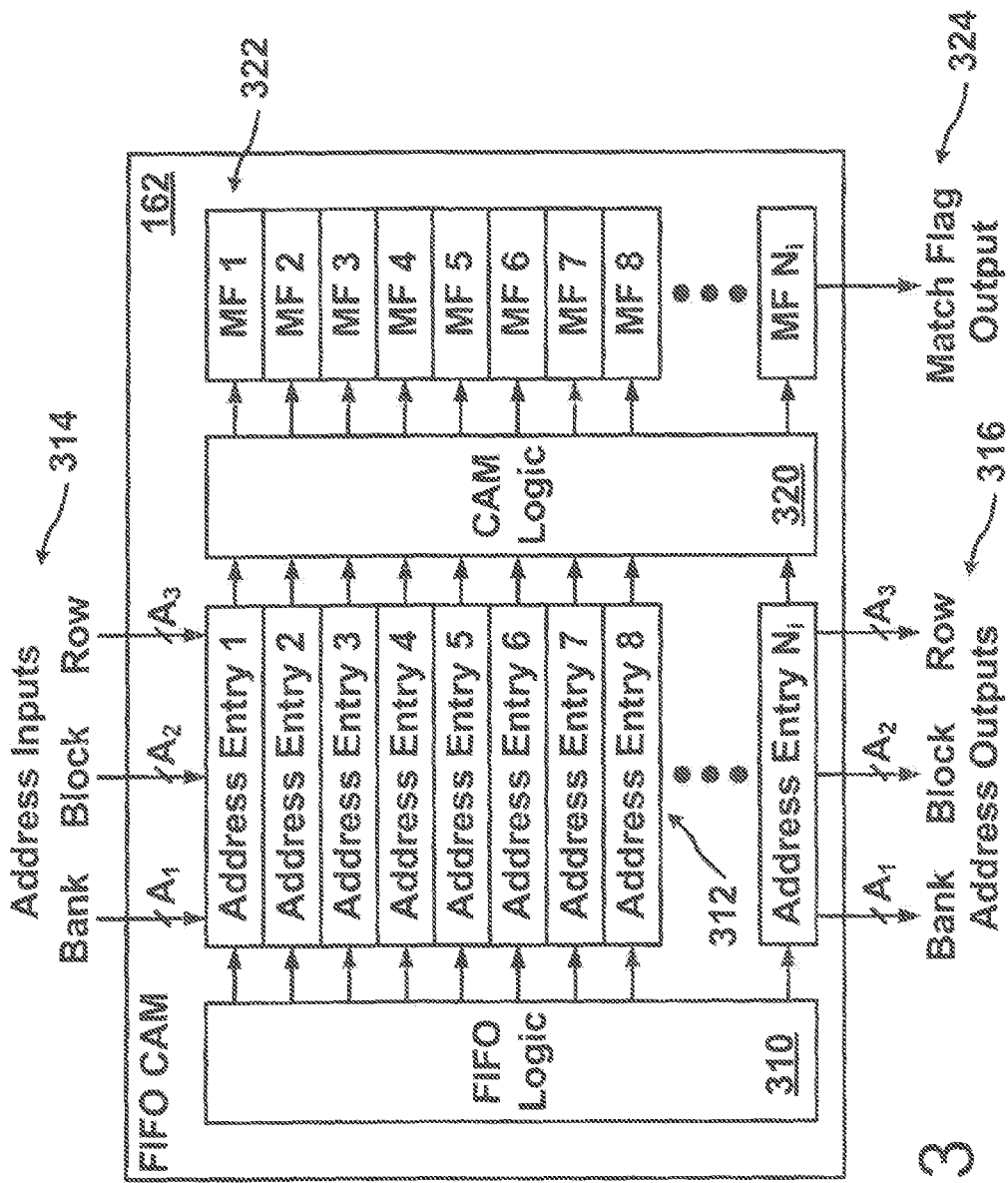
FIG. 3 illustrates a FIFO CAM in accordance with an embodiment of the present invention.

FIG. 3 illustrates FIFO CAM 162 in accordance with the embodiment of the present invention described in FIG. 1 which serves as the first level of row address filtering. Both FIFO and CAM memories are known in the art; a FIFO CAM memory embodies the distinctive features of both.

A FIFO is a first-in/first-out memory. Data is written into a FIFO as a series of data words. Data is then read out of the FIFO in a series of data words in the same order as they were originally written. There are many types of FIFO with a variety of features and styles of implementation known in the art. The particular implementation of the FIFO portion of FIFO CAM 162 is a matter of design choice.

A CAM is a content addressable memory. In a typical CAM, data words may be written into or read from a particular address in the memory just as in a typical SRAM (static random access memory). In a comparison mode, the CAM is typically presented with a data word at the data input port and the memory contents are evaluated to determine if the data presented is already resident in the memory. In FIFO CAM 162, the data reading and writing is handled by the FIFO portion of the circuitry, while the CAM portion compares an input data word to the current contents to determine if a match is present at the time it is presented to FIFO CAM 162 for writing. There are many types of CAM with a variety of features and styles of implementation known in the art. The particular implementation of the CAM portion of FIFO CAM 162 is a matter of design choice.

Returning to FIG. 3, FIFO CAM 162 comprises FIFO logic 310, a number ($N_i$) of address entries 312, a number ($A_1+A_2+A_3$) of address inputs 314, a number ($A_1+A_2+A_3$) of address outputs 316, CAM logic 320, a number ($N_i$) of match flags 322 (labeled MF 1 through MF $N_i$), and a match flag output 324.

The plurality of address entries 312 may be thought of as a shift register that is $N_i$ words deep and ($A_1+A_2+A_3$) bits wide, though many different implementations are possible and fall within the scope of the invention. The value for $N_i$ is embodiment dependent and a matter of design choice. It may be programmable and selected after testing integrated circuit 100 in some embodiments. Typically, a minimum value of $N_i$=2*$N_{TRR(max)}$+1 is desired for reasons described below. Thus in the exemplary embodiment described $N_i \geq 31$ since $N_{TRR(max)}$=15. Persons skilled in the art will realize that the value chosen for $N_i$ may be adjusted in a particular embodiment to accomplish other design objectives.

FIFO logic 310 is coupled to command decoder 114 as shown in FIG. 1. Whenever an ACT command may be presented to DRAM 100, the corresponding row address from address input 122 may be presented to address inputs 314 to be written into address entry 1. At the same time the previous contents of address entry 1 may be shifted into address entry 2, the previous contents of address entry 2 may be shifted into address entry 3, and so forth, up to and including the previous contents of address entry $N_{i-1}$ may be shifted into address entry $N_i$. The reason for the "+1" portion of $N_i=2*N_{TRR(max)}+1$ is so the previous contents of address entry $N_{i-1}$ (now in the last address entry N) may be compared to the new entry in address entry 1 by the CAM logic 320 before being evicted from the FIFO.

FIG. 4A illustrates an abstraction of the operation of a FIFO CAM 400 in accordance with an embodiment of the present invention. In this example, $N_i$=8 for simplicity of explanation. FIFO CAM 400 has eight instances of address entry 412, a plurality of address inputs 414, a plurality of address outputs 416, eight match flags 422, one associated with each address entry 412, and a match flag output 424.

FIG. 4A illustrates the contents of FIFO CAM 400 after the most recent eight ACT commands. Each ACT command had an associated active row address represented from first to last by address A, B, C, D, E, F, G and H. Address H is the currently active row address (CARA) being associated with the currently active ACT command. Each of the earlier addresses A-G is a previously active row address (PARA). When the currently active ACT command was asserted, address H was written into an address entry 412, while each of the addresses A-G and their associated match flags 422 are shifted down one position. After the shifting, then address A is read out of FIFO CAM 400 along with its associated match flag for further processing. Since all eight of the address entries 412 contain a unique address, all of the match flags were set to logic-0 as each of the address entries 412 were stored.

FIG. 4B illustrates the contents of FIFO CAM 400 after a ninth ACT command with address B being the associated currently active row address. As in FIG. 4A, all of the addresses B-H and their match flags 422 are shifted down one position, address A is overwritten in the last address entry 412, and address B (the CARA) is written into the first address entry 412. Since address B matches one or more of the stored PARAs, the CAM logic (not shown in FIG. 4B) detects the matching condition and sets the match flag to logic-1 for both entries. The first instance of address B and its match flag 422 (now set to logic-1) are read out of FIFO CAM 400 for further processing on address outputs 416, and match flag output 424.

Figures 4C, 4D:
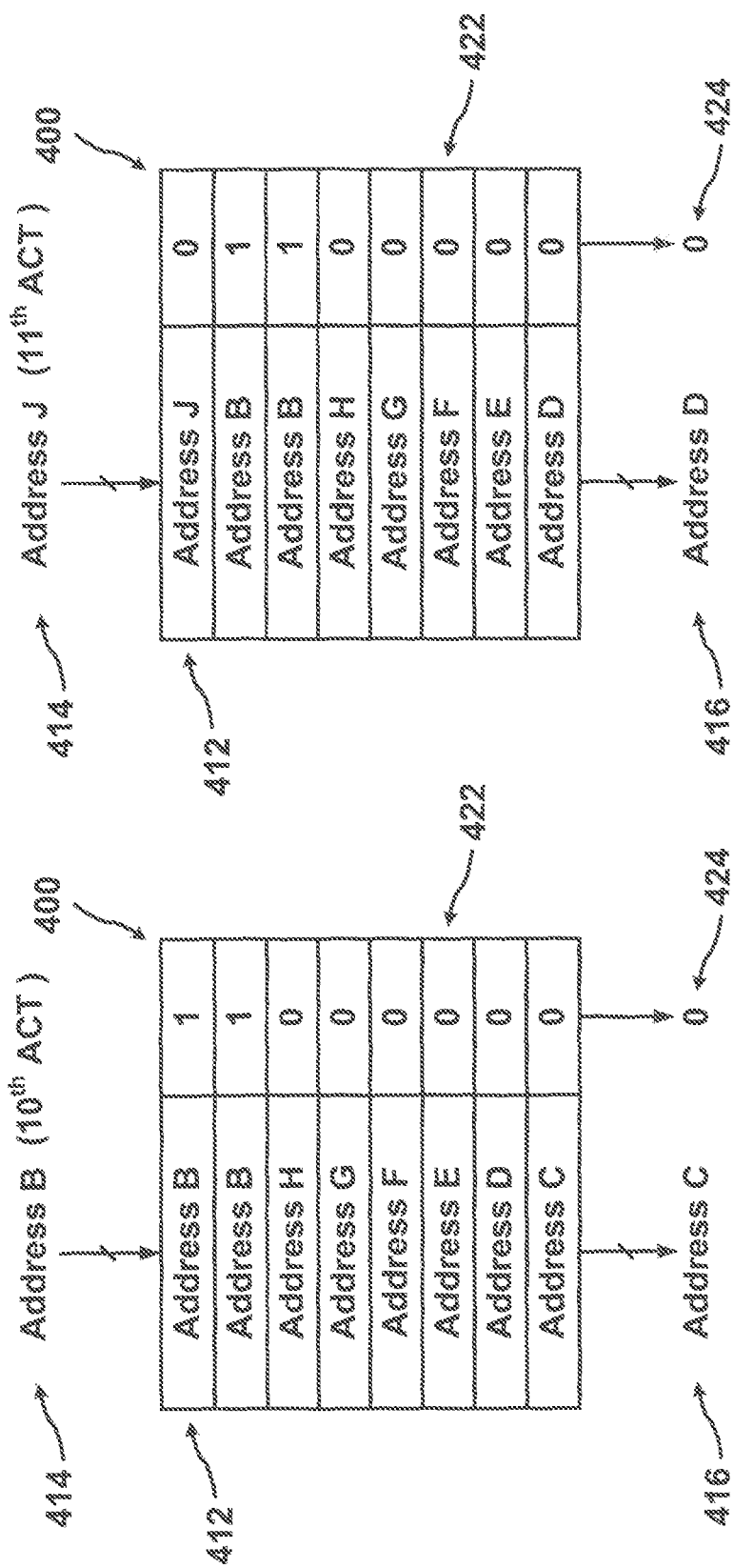

FIG. 4C illustrates the contents of FIFO CAM 400 after a tenth ACT command with address B again being the CARA. As before, the address entries 412 and their match flags 422 are all shifted down one location. Since address B matches another entry, the match flags for both those entries are set to logic-1. In a case like this when the match flag 422 has already been previously set to logic-1 it remains at logic-1. After the shifting and matching, address C and its match flag are read out of FIFO CAM 400 for further processing on address outputs 416, and match flag output 424.

FIG. 4D illustrates the contents of FIFO CAM 400 after an eleventh ACT command with address J being the associated CARA. As before, the address entries 412 and their match flags 422 are all shifted down one location. Since address J does not match another entry, the match flag for its entry is set to logic-0 and no other match flags 422 are changed. After the shifting and matching, address D and its match flag are read from FIFO CAM 400 for further processing on address outputs 416, and match flag output 424.

Returning to DRAM 100 in FIG. 1, the address outputs 316 (not labeled in FIG. 1) from FIFO CAM 162 (the first level row address filter) are coupled to address inputs of BBR CAM 164 (which serves as the second level row address filter).

As discussed above, the number of address entries 312 in FIFO CAM 162 may be a minimum of $N_i=2*N_{TRR(max)}+1$. The need for the "+1" portion of the $N_i$ equation was illustrated in FIGS. 4A-4D, that is the new entry may be matched to the oldest entry in FIFO CAM 162 before it is evicted and sent on to BBR CAM 164. The need for the "$2*N_{TRR(max)}$" portion of the $N_i$ equation has to do with efficient filtering of the stream of currently and previously activated row addresses. If an address is part of a row hammering attack, it needs to occur an average of once every $N_{TRR(max)}$ ACT commands to be effective. FIFO CAM 162 having slightly more than twice $N_{TRR(max)}$ address entries will catch all occurrences where an activated row address shows up twice within $2*N_{TRR(max)}$ ACT commands. Thus CARAs that do not occur frequently enough to be flagged will simply be ignored by the second stage of the filter since their match flags do not get set.

Figure 5:
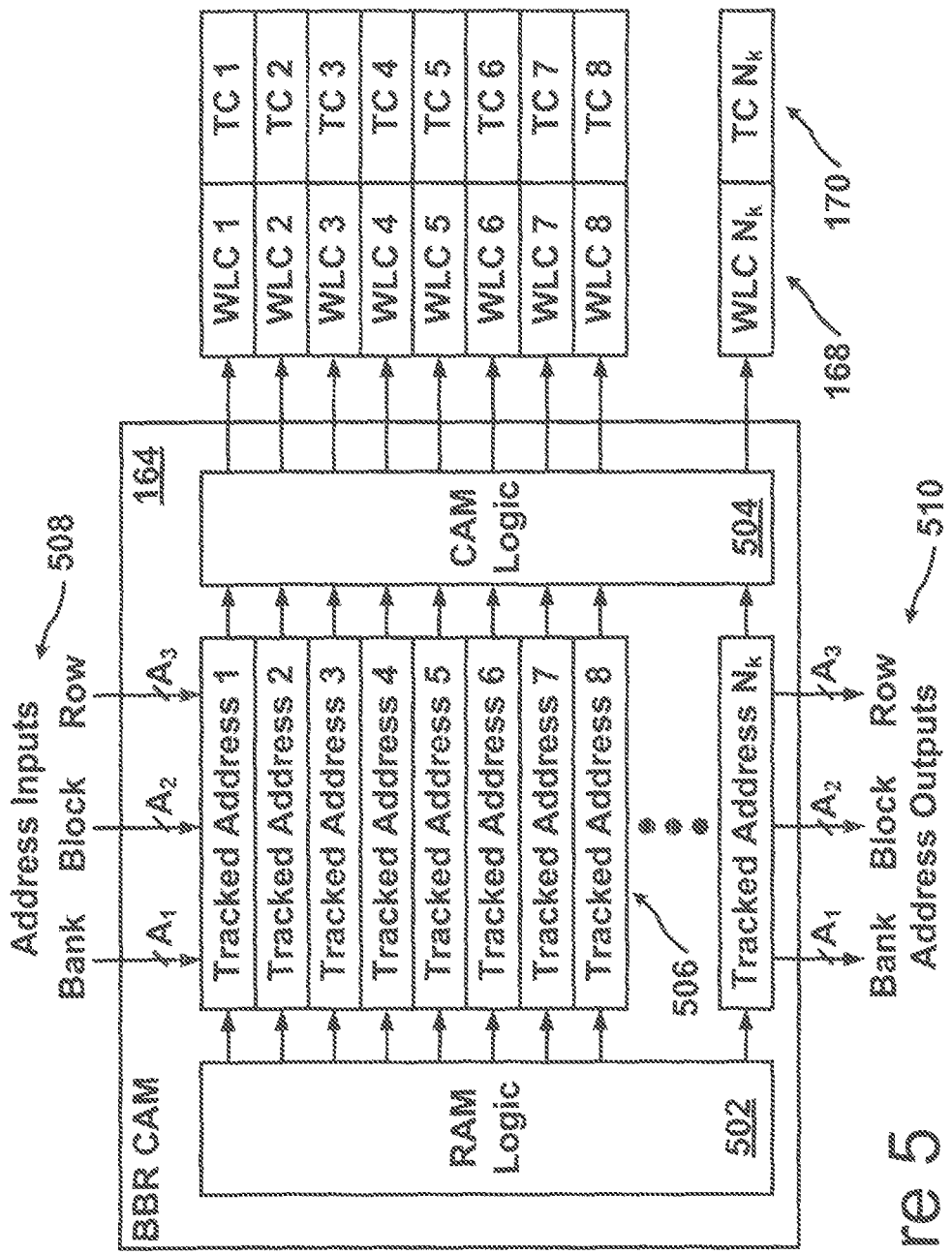
FIG. 5 illustrates a BBR CAM according to an embodiment of the present invention.

FIG. 5 illustrates a bank/block/row address CAM (BBR CAM) 164 suitable for use in DRAM 100, which serves as the second stage of the address filter. BBR CAM 164 comprises random access memory (RAM) logic 502, CAM logic 504, a plurality ($N_k$) of tracked address entries 506, bank/block/row address inputs 508, and bank/block/row address outputs 510. Each tracked address entry 506 in BBR CAM 164 has an associated watch list counter (WLC 1 through WLC $N_k$) 168 and a tenure counter (TC 1 through TC $N_k$) 170.

RAM logic 502 and CAM logic 504 are controlled by the TRR logic 166 of FIG. 1 (not shown in FIG. 5). When a previously activated row address (PARA) is presented to BBR CAM 164 from FIFO CAM 162, the TRR logic 166 commands the CAM logic 504 to seek a match with one of the tracked address entries 506. If a match occurs, then the tracked address entry is already being monitored with a watch list counter 168. In this case the associated watch list counter 168 is incremented to keep track of the total number of times the PARA has been activated since its last refresh and the PARA and its associated match flag are discarded. This keeps the contents of each tracked address entry 506 in the BBR CAM 164 unique so that a particular PARA is only tracked by one watch list counter 168 and one tenure counter 170 at any given time.

If the PARA from FIFO CAM 164 does not match a tracked address entry 506 in BBR CAM 166, but its match flag 324 is set to logic-1, then the contents of a tracked address entry 506 are evicted from BBR CAM 164 and replaced by the PARA while the associated watch list counter 168 and tenure counter 170 for that tracked address entry 506 are initialized (both set to logic-1 in some embodiments) to start tracking that PARA, and the associated match flag is discarded.

If the PARA from FIFO CAM 164 does not match a tracked address entry 506 in BBR CAM 166 and its match flag is set to logic-0, then the PARA and its associated match flag are discarded. In this manner, PARAs occurring at less than the row hammer danger rate are thus ignored by the second stage of the filtering process. Thus the two stage filtering performed by FIFO CAM 162 and BBR CAM 164 efficiently track only the row addresses that may be part of a row hammering attack.

FIGS. 6A through 6G illustrate a simplified abstraction, generally indicated by reference number 600, of a BBR CAM 664 and its associated watch list counters 668 and tenure counters 670 in accordance with the principles of the present invention. In this particular exemplary case, the value $N_k=8$ (defined in FIG. 5 as the total number of BBR CAM entries) and the value of another term $N_{TENURE(min)}=4$ (defined as the minimum tenure an entry must remain in BBR CAM 664 before it is eligible to be evicted) are chosen. Before a previously activated row address (PARA) entry can be evicted in favor of a new PARA its associated tenure counter 670 value must exceed $N_{TENURE(min)}$. Persons skilled in the art will realize that the values $N_k=8$ and $N_{TENURE(min)}=4$ may be too small for a practical design as per the discussion of the equations 202 through 214 in FIG. 2. That is not important since the purpose of these figures is to provide an easily understood example of BBR CAM operation that is typical of BBR CAMs in other embodiments like, for example, BBR CAM 164 in FIG. 1.

Turning now to FIG. 6A, BBR CAM 664 comprises eight tracked address entries 606 and a PARA address input 608. Each row 620 in the figure comprises a single tracked address entry 606 and its associated watch list counter 668 and tenure counter 670. Each row is given a unique reference number 620-1 through 620-8 (since $N_k=8$ in this example).

The contents of rows 620-1 through 620-8 in FIG. 6A illustrate an initial fill of BBR CAM 664 (after, for example, a global refresh operation) by a series of eight previously accessed row addresses (PARAs) in order from first to last: PARA A, PARA B, and so on through PARA H. Those skilled in the art will appreciate that other initial sequences may occur, or the BBR CAM 664 may be initialized into such a state (by, for example, reset logic) without processing an initial sequence and that all such cases fall within the scope of the invention.

Since each PARA has occurred once since the last refresh cycle for any of these rows, the value in each watch list counter 668 is 1. Since PARA A was first, its associated tenure counter 670 in row 620-8 has a value of 8. Similarly, since PARA B was second, its associated tenure counter 670 in row 620-7 has a value of 7, and so on through PARA H which was last and its associated tenure counter 670 in row 620-1 has a value of 1.

Turning to FIG. 6B, the state of BBR CAM 664 and its associated watch list counters 668 and tenure counters 670 is illustrated after a number of operations beginning with the state of FIG. 6A. In general, the operations described in conjunction with FIGS. 6B through 6G assume starting with the state of BBR CAM 664 and its associated watch list counters 668 and tenure counters 670 shown in FIGS. 6A through 6F respectively, the exception being FIG. 6H which also starts with the state of FIG. 6F. Thus FIGS. 6A through 6G illustrate seven different points in time during a longer sequence of operations chosen to illustrate the features and operation of BBR CAM 664, while FIG. 6H shows an alternate embodiment with a different design parameter for contrast to FIG. 6G.

In the case illustrated in FIG. 6B, a series of 10,000 consecutive instances of PARA D has been received. This may be part of a simple and direct row hammering attack. Note that the watch list counter 668 on row 620-5 has been incremented from 1 to 10,001. Similarly, all of the tenure counters 670 on all rows 620 have also been incremented 10,000 times relative to the state shown in FIG. 6A indicating the number of ACT commands they have been resident.

Turning now to FIG. 6C, another 10,000 operations have been processed by BBR CAM 664 and its associated watch list counters 668 and tenure counters 670: 2,000 instances of PARA A along with 5,000 instances of PARA B and 3,000 instances of PARA C. The watch list counter 668 on row 620-8 where the tracking entry 606 for PARA A is kept has been incremented 2,000 times. Similarly, the watch list counter 668 on row 620-7 where the tracking entry 606 for PARA B is kept has been incremented 5,000 times. Lastly, the watch list counter 668 on row 620-6 where the tracking entry 606 is kept for PARA C is has been incremented 3,000 times. The tenure counters 670 have all be incremented 10,000 times as well. Note that these 10,000 operations may occur in any order and the counter values shown in FIG. 6C would be the same.

FIG. 6D illustrates a case where three more PARA operations have been processed by BBR CAM 664 and its associated watch list counters 668 and tenure counters 670: a single instance of PARA E, PARA G and PARA H. In the figure the watch list counters 668 on rows 620-4, 620-2 and 620-1 have all been incremented once while the tenure counters 670 have all been incremented by three relative to FIG. 6C. Notice that all of the tenure counters 670 have values that exceed the value of $N_{TENURE(min)}=4$. This makes them all candidates for eviction if a different PARA is presented to BBR CAM 664.

FIG. 6E illustrates such a case where new PARA J is presented for processing. The CAM circuitry (not shown in FIG. 6E) of BBR CAM 664 will not find a match with any of the tracked address entries 606, so the contents of one row 620 must be selected for eviction. The first criterion for choosing a row 620 for the new PARA is the one with the lowest value in watch list counter 668 having a value of tenure counter 670 greater than $N_{TENURE(min)}$ (four in this case). Since all rows have sufficient tenure, row 620-3 is selected since its watch list counter 668 has the lowest value. Its tracked address entry 606 is overwritten with PARA J and its watch list counter 668 and tenure counter 670 both reset to one and all the other tenure counters 670 are incremented.

FIG. 6F illustrates a case where PARA K, PARA L and PARA M are presented to BBR CAM 664 for processing in that order from the state illustrated in FIG. 6E. Notice that PARA K is not a match, all rows 620 except for 620-3 have a value greater than $N_{TENURE(min)}$ in their tenure counters 670, and rows 620-1, 620-2 and 620-3 are tied for the lowest value in their watch list counters 668. Thus the second criterion for choosing a row 620 for eviction comes into play: the row 620 with the highest value in its tenure counter is replaced. Persons skilled in the art will realize that other methods for implementing the second criteria are possible (e.g., choosing one of the tied rows 620 using a pseudo-random number sequence, etc.).

Persons skilled in the art will realize that once a row 620 has counted to the point of sufficient tenure there is no reason to keep counting the tenure of a row 620. Such skilled persons will realize that the large tenure counts shown in FIGS. 6A through 6H were shown to illustrate the principles of BBR CAM 164 operation, that much smaller counters could be used in an embodiment of the present invention, and that tenure counters of any length are within the scope of the invention.

Notice that once BBR CAM 664 is full (e.g., all rows 620 are track PARAs) or reset to an appropriate state, each row will have a different value in its tenure counter since all tenure counters are incremented for each presented PARA. BBR CAM 664 may be designed so that when initialized it has a different value in each tenure counter 670 ranging from 1 to $N_{TENURE(min)}$ to simplify the logic design.

Applying the second criterion, row 620-4 is evicted and replaced by PARA K, row 620-2 is in turn evicted and replaced by PARA L, and lastly row 620-1 is evicted and replaced by PARA M. Notice that except for each evicted row in its turn (when its tenure counter is initialized to one), all of the tenure counters 670 of all the other rows 620 increment each operation.

FIG. 6G illustrates a case where PARA P is presented to BBR CAM 664 for processing from the state illustrated in FIG. 6F. Since the tenure counters 670 in rows 620-1, 620-2, 620-3 and 620-4 are all less than or equal to $N_{TENURE(min)}$ in FIG. 6F, they are ineligible for eviction and row 620-8 is selected for eviction (due to having the lowest value of watch list counter 668) and PARA P is written into its tracked address entry 606 and its watch list counter 668 and tenure counter 670 are both reset to one. This illustrates that rows 620 with high watch list counter 668 values (e.g., row 620-8) may be eliminated by a sophisticated row hammering attack if sufficient care is not taken.

FIG. 6H illustrates a case in an alternate embodiment where the design parameter $N_{TENURE(min)}=3$ (instead of $N_{TENURE(min)}=4$ as in FIGS. 6A through 6G). The initial state of FIG. 6F is chosen for convenience and how it came about is not important for this embodiment. In this case, row 620-3 with a low value in its watch list counter 668 is eligible for evection and is evicted and replaced by PARA P. Contrast this with FIG. 6G where row 620-8 with a much higher value in its watch list counter 668 was evicted which is not a desirable result.

Figure 7:
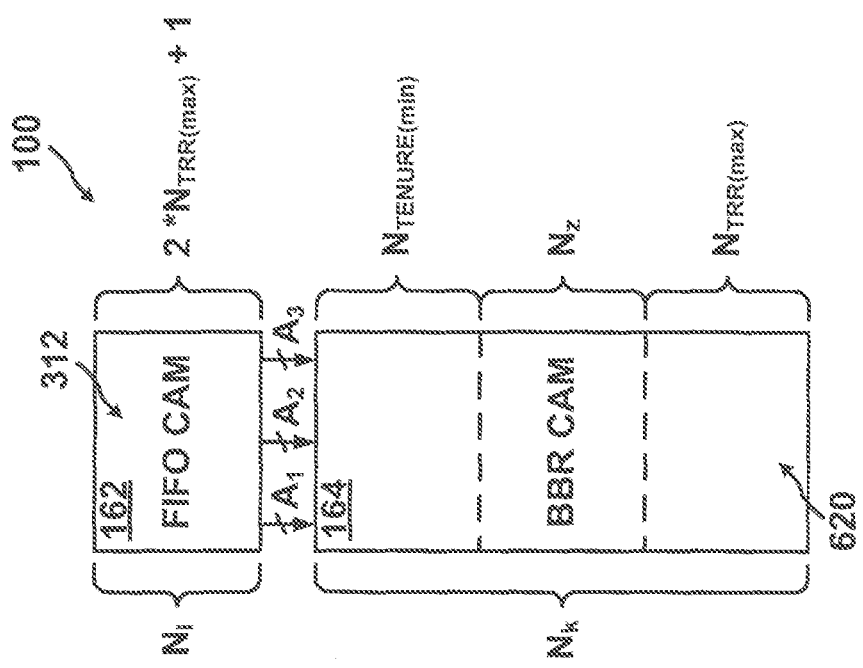
FIG. 7 illustrates an abstraction of the allocation of the number of rows in a BBR CAM in accordance with an embodiment of the present invention.

Turning now to FIG. 7, FIFO CAM 162 is shown coupled to BBR CAM 164 as in the exemplary embodiment DRAM integrated circuit 100 of FIG. 1. FIFO CAM 162 comprises a number ($N_i$) of entries 312, and BBR CAM 164 comprises a number ($N_k$) of rows 620.

As discussed earlier, $N_{TRR(max)}$ is an empirically determined design value representing the maximum number of rows that may be targeted during a refresh cycle. In the exemplary embodiment of FIG. 1, $N_{TRR(max)}=15$ as derived by the exemplary equations of FIG. 2. Those skilled in the art will realize that other embodiments may have different values of $N_{TRR(max)}$ and for the various other design variables. Such skilled persons will also appreciate that the chosen value of $N_{TRR(max)}$ may be hard wired into the design or selected and/or programmed later as a manufacturing or user choice.

The desired size of FIFO CAM 162, $N_i=2*N_{TRR(max)}+1$, was discussed in conjunction with FIG. 3 and is related to the rate at which instances of a target row address must be presented to the DRAM integrated circuit 100 to pose a danger of a successful row hammer attack. If an instance of a new active row address does not occur with sufficient frequency (e.g., twice within $N_i$ row activations) then it is ignored unless it is already currently tracked by BBR CAM 164 in which case the associated watch list counter 168 in the associated word 620 is incremented. Thus the maximum average rate at which new row addresses (that might be used to evict a row with a large value in its watch list counter 168) is $N_{TRR(max)}$ PARAs per $N_i$ row activations.

Returning to FIG. 7, see the $N_k$ rows 620 of BBR CAM 164 are conceptually divided into three regions. Note that the physical addresses of the tracked address entries 606 are determined by the incoming sequence of PARAs from FIFO CAM 162 and may be physically and randomly scattered all over the array. FIG. 7 is abstract in that it assumes groups of different rows are logically grouped together to facilitate explanation.

The size of the first region may be $N_{TRR(max)}$ rows 620. Since this is the maximum possible number of potentially successful row hammer attacks this number of rows 620 should be available to store the highest watch list counter 668 values. In general, as these values continue to rise the contents of these rows 620 become harder to evict.

The size of the second region may be $N_{TENURE(min)}$ rows 620 which is the length of time a row 620 must remain resident in BBR CAM 164 before it can be evicted. The tenure requirement defends against row hammer algorithms devised by attackers with knowledge of the operation of FIFO CAM 162 and BBR CAM 164 which will be discussed below.

The size of the third region $N_z$ may be at least one. This is to provide one or more rows 620 so that a high value row may not be evicted and replaced by a new PARA entering BBR CAM 164 as happened in the case described in conjunction with FIG. 6G. In contrast, by reducing $N_{TENURE(min)}$ from four instead of three in FIG. 6H, effectively a third region with $N_z=1$ was created and protected one of the high value rows 620 in the first region.

Figure 8A:
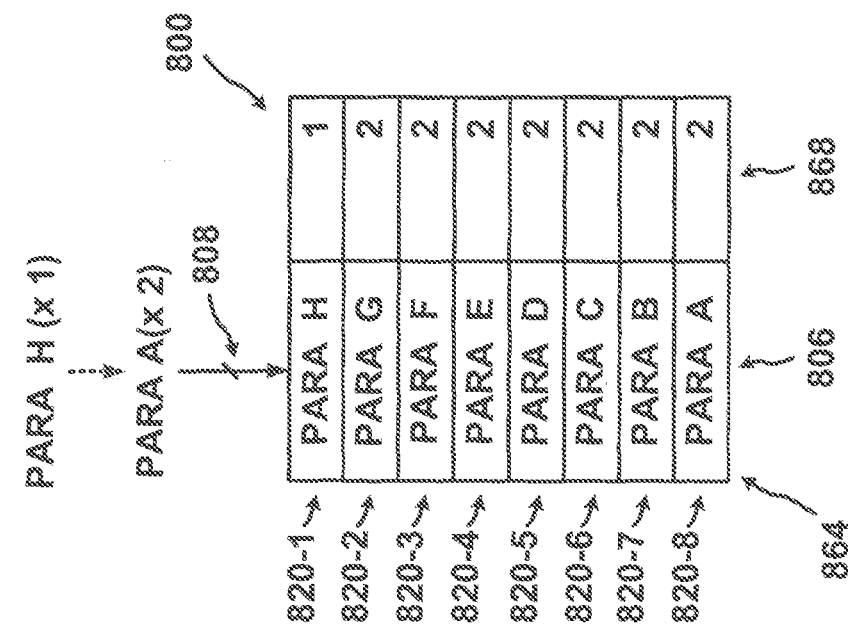
FIGS. 8A through 8C illustrate the need for tenure counters in a BBR CAM in accordance with an embodiment of the present invention.
Figure 8C:
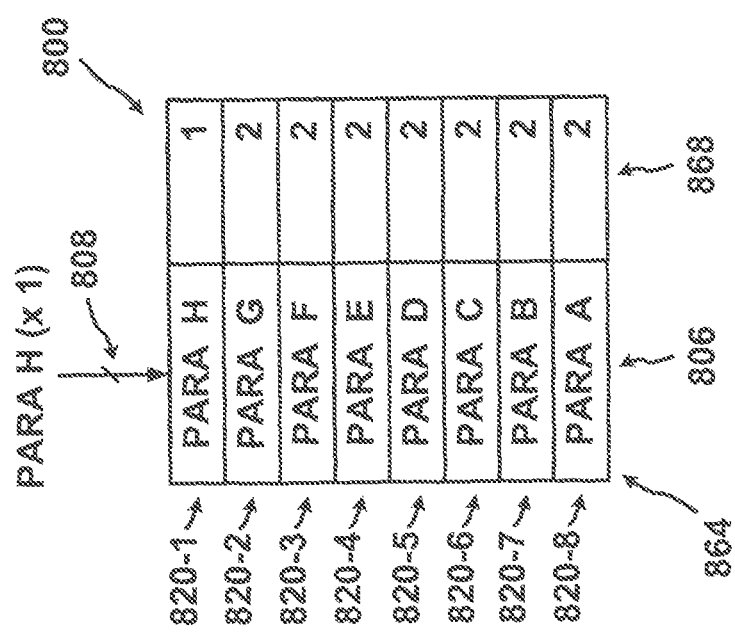
Figure 8B:
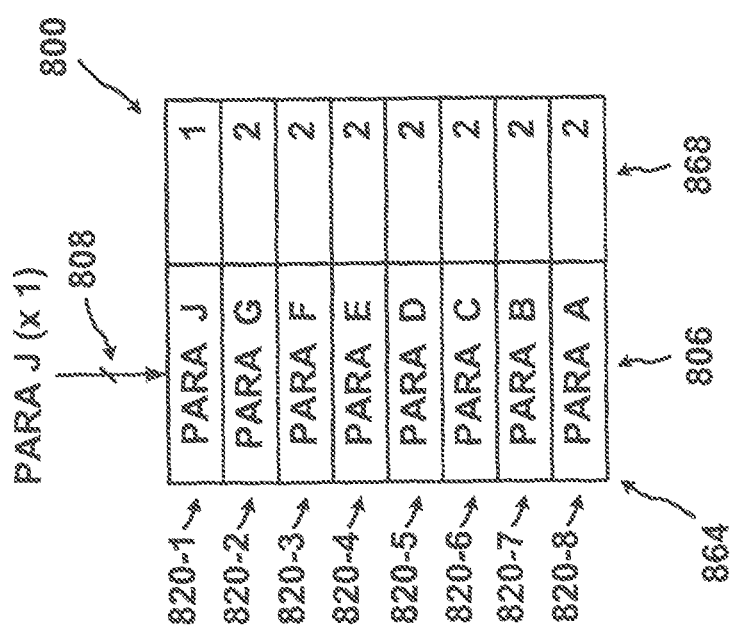

FIGS. 8A, 8B and 8C illustrate a series of operations on an embodiment generally indicated by reference number 800 comprising BBR CAM 864, which further comprises eight tracked address entries 806 and a PARA address input 808. Eight watch list counters 868 are present, however there are no tenure counters. Each BBR CAM 864 row 820 comprises a single tracked address entry 806 and a single watch list counter 668. Each row is given a unique reference number 820-1 through 820-8 (since $N_k=8$ in this example).

FIG. 8A shows BRR CAM after being initialized by a sequence of 15 PARAs. Every row 820 has a value of 2 in its watch list counter 868 except for row 820-1 which has a value of 1. Since this example assumes no tenure requirement row 820-1 with the lowest count is the logical choice for an eviction. Note that aside from randomly, pseudo-randomly or sequentially (or some other arbitrary method) selecting between the other rows 820 there no logical basis for making the selection. In general, we want to evict rows with lower watch list counts and keep the ones with higher counts.

FIG. 8B shows BBR CAM 800 starting in the state of FIG. 8A after PARA J has been presented to it, evicting PARA H from row 820-1. Similarly, FIG. 8C shows BBR CAM 800 starting in the state of FIG. 8B after PARA H has been presented to it, evicting PARA J from row 820-1. Notice that the state of BBR CAM 800 in FIG. 8C is identical to its state in FIG. 8A. If this were to be repeated with a continuous stream of H, J, H, J, H, J, etc., a row hammering attack on the memory rows addressed by PARA H and PARA J would go unnoticed and be successful since no rows 820 in BBR CAM 800 would be tracking them.

The example of FIGS. 8A, 8B and 8C illustrates the purpose of the tenure requirement in, for example, BBR CAM 164 in DRAM 100 of FIG. 1. As discussed above, FIFO CAM 162 filters the stream of all address accesses and only flags the addresses that occur frequently enough to be a row hammering threat. BBR CAM 164 further filters the flagged addresses coming from FIFO CAM 162 by keeping track of the most dangerous ones while discarding ones with lower watch list counts (that may have been frequently accessed for enough time to get flagged, but have slowed down and are thus no longer a danger) and replacing them with new candidates that are currently occurring with a dangerous frequency.

Since $N_{TRR(max)}$ is the largest number of simultaneous row hammer attacks, $N_{TENURE(min)}$ must be large enough to have a row entry 620 for each of the $N_{TRR(max)}$ simultaneous attacks. This will force the attacker to have a bogus PARA for each real attack trying to evict the high watch list counter 868 values to replace them with lower ones. By adding one or more additional rows 820 (NO the time it takes to evict a row is increased to the point where there is insufficient time in a refresh cycle to maintain both an attack and simultaneously evict the rows 820 monitoring that attack. This ensures the real attack addresses can all be tracked in BBR CAM 164 without being evicted by calculated patterns of other addresses introduced into the address attack stream.

Figure 9:
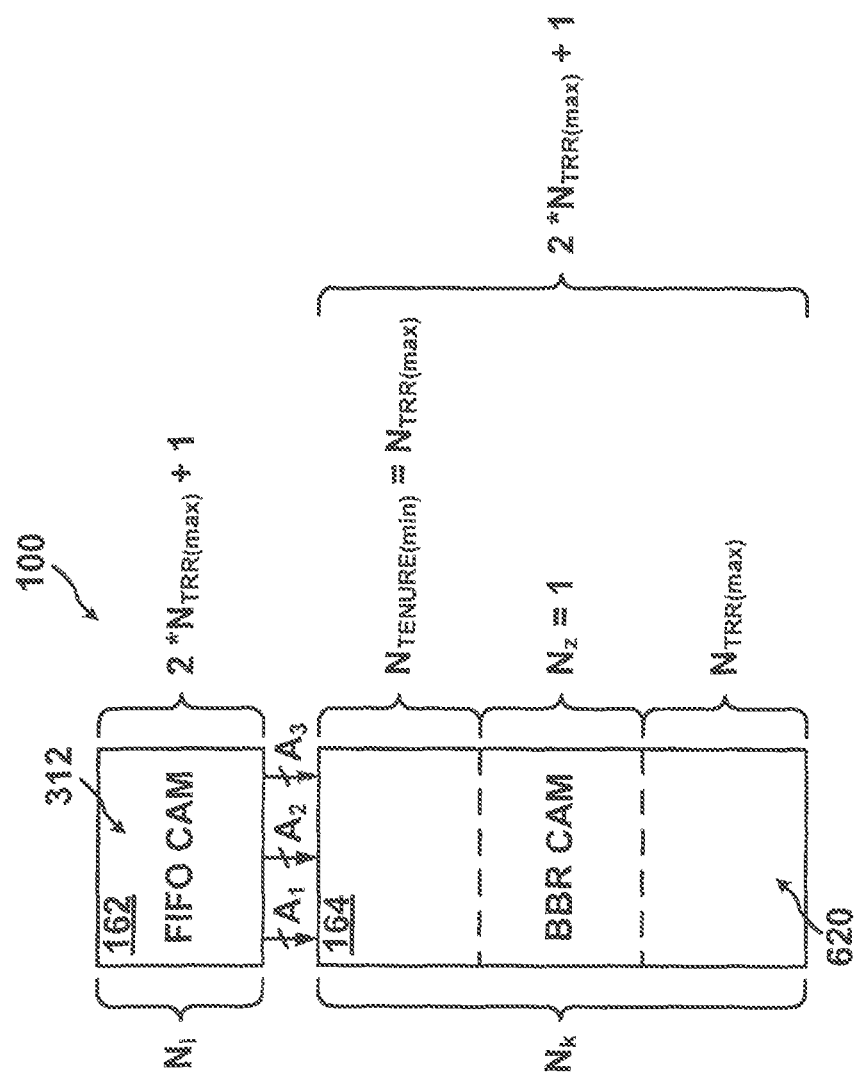
FIG. 9 illustrates an abstraction of the allocation of the number of rows in a BBR CAM in accordance with an embodiment of the present invention.

Turning now to FIG. 9, FIFO CAM 162 is shown coupled to BBR CAM 164 as in the exemplary embodiment DRAM integrated circuit 100 of FIG. 1. FIFO CAM 162 comprises a number ($N_i$) of entries 312, and BBR CAM 164 comprises a number ($N_k$) of rows 620.

As in FIG. 7, the $N_k$ rows 620 of BBR CAM 164 in FIG. 9 are conceptually divided into the same three regions as in FIG. 7. Note that the physical addresses of the tracked address entries 606 are determined by the incoming sequence of PARAs from FIFO CAM 162 and may be physically scattered all over the array. FIG. 9 is abstract in that it assumes groups of different rows are logically grouped together to facilitate explanation.

Based on the discussion of FIGS. 8A through 8C above, the values of $N_{TENURE(min)} = N_{TRR(max)}$ and $N_z = 1$ are shown. Taken together the resulting value of $N_k = 2*N_{TRR(max)} + 1$. While it is the case that in the embodiment described in FIG. 9 that $N_i = N_k$, that may not be the case in other embodiments of the present invention.

Persons skilled in the art will appreciate that there might be design tradeoffs where the values of Ni and Nk may be determined differently. For example, in the equations of FIG. 2, $N_{TRR(max)}$ was for $N_i$ calculated as 14.4 and then rounded up to the nearest integer 15, but in another embodiment the calculation could also done without rounding until the end: $N_i = 2*14.4 + 1 = 29.8$ which rounds up to 30 instead of $N_i = 2*15 + 1 = 31$. While this saves an entry in the FIFO CAM, it is not desirable to calculate that way for $N_k$ which should round up and have a value of 31 in either case to avoid unwanted evictions of high count rows. Such skilled persons will also appreciate that, for example, some embodiments may have additional entries 312 and/or rows 620 to increase the guard banding (e.g., safety margin) as a matter of design choice and that all such cases are within the scope of the invention.

Returning to FIG. 1, refresh counter 118 is shown coupled to BBR CAM 164. During normal operation all the rows will periodically be refreshed in a sequence determined by refresh counter 118. During a refresh operation, the contents of refresh counter 118 are presented to BBR CAM 164 to determine if the row being refreshed matches one of the potential target rows tracked addresses 506.

Since the damage in a row hammering attack occurs in rows adjacent to the target row, the preferred way to ensure that the damage is contained is to make sure that the refresh counter sequence ensures that adjacent rows get refreshed in consecutive refresh operations, though other sequences may be used.

Thus if there is a match with refresh counter 118, then there is no reason to further monitor that particular PARA since any row hammering damage to the data in adjacent rows has just been corrected and/or soon will be corrected by prior and/or subsequent regular refresh operations. In such a case, TRR logic 166 resets the watch list counter 168 and the tenure counter 170 to their reset states. Both may set to one, but other values (e.g., zero) may be used. This effectively resets the monitoring of the PARA in tracked address 506 in which will either continue to count matches or be evicted based on the future stream of PARAs from FIFO CAM 162. Alternatively, the contents of tracked address 506 may be reset to its reset value. Persons skilled in the art will appreciate that there are other ways to implement this function and all of them are within the scope of the invention.

Returning to FIG. 1, BBR CAM 164 is shown coupled to target row refresh queue (TRRQ) 172. When the value of a watch list counter 168 exceeds the value of $N_{WC}$ (from equation 210 in FIG. 2), TRR control logic 166 commands BBR CAM 164 to send the associated PARA in its tracked address entry 606 to the TRRQ 172 and then, when the non-regular data loss mitigation refresh operation is complete, to reset the row 620 as if it had been refreshed by a regular refresh command. TRRQ 172 is coupled to multiplexer 134 in each bank address path 130. Refresh control logic 116 may then use multiplexer 134 to select the correct address from TRRQ 172 when performing a non-regular data loss mitigation refresh operation.

Figure 10:
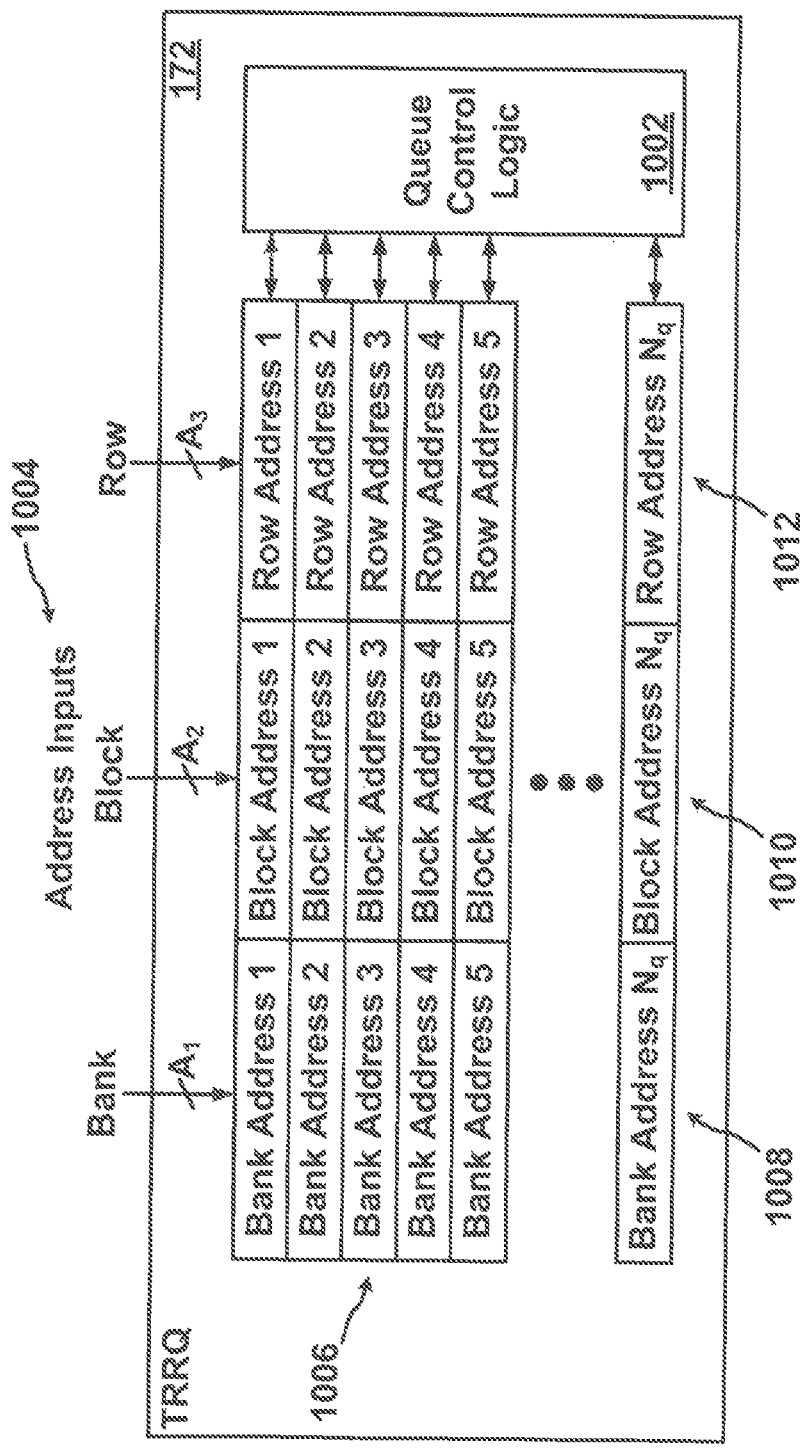
FIG. 10 illustrates a target row refresh queue according to an embodiment of the present invention.

Turning now to FIG. 10, TRRQ 172 comprises queue control logic 1002, address inputs 1004 coupled to BBR CAM 164, and a number ($N_q$) of queue entries 1006. Each queue entry 1006 further comprises a bank address register 1008 (labeled Bank Address 1 through Bank Address $N_q$), a block address register 1010 (labeled Block Address 1 through Block Address $N_q$), and a row address register 1012 (labeled Row Address 1 through Row Address $N_q$).

The exact number of queue entries 1006 is a matter of design choice, though a best case minimum value may be $N_{TRR(max)}$. If an attacker has detailed knowledge of the circuitry of global TRR path 160, a calculated stream of incoming addresses might be designed to trigger a non-regular data loss mitigation refresh operation for as many as $N_{TRR(max)}$ watch list counters 168 on as many consecutive ACT commands. If the number of entries 1006 is insufficient, then TRRQ 172 may overflow resulting in lost data. This could be compensated for in queue control logic 1002, or in TRR Logic 166, or in some other manner, though supplying enough entries 1006 for the $N_{TRR(max)}$ dangerous target rows with the highest value watch list counters 168 may be simpler and less expensive. Those skilled in the art will realize that any method of preventing a TRRQ 172 overflow is within the scope of the invention.

Queue control logic 1002 monitors the tenure and occupancy of entries 1006 and analyzes the contents of each bank address register 1008. When there are occupied entries 2006 awaiting a special TRR refresh operation, the queue control logic 1002 may determine which banks have a pending TRR refresh entry 1006. Queue control logic 1002 then sends the contents of block address register 1010 and row address register 1012 for at least one entry 1006 to the bank addressed in the associated bank address register 1008. Queue control logic 1002 is coupled to refresh control logic 116 (not shown) and notifies it that one or more entries in TRRQ 172 need a special refresh operation. Refresh control logic 116 in turn schedules a non-regular data loss mitigation refresh operation, which will occur during a subsequent refresh command. During such a non-regular data loss mitigation refresh operation the value in the refresh counter does not change so it may resume regular refresh operations at the same location without skipping a location in the sequence of regular refresh operations.

If a plurality of entries 1006 are occupied and the bank address registers 1008 are for multiple banks, then in some embodiments multiple entries 1006 may be sent to different banks to allow simultaneous non-regular data loss mitigation refresh operations to occur simultaneously in those banks. If more than two entries 1006 address the same bank, the one with the highest tenure is sent to that bank and the other is retained for a subsequent special TRR refresh operation. In other embodiments entries 1006 in TRRQ 172 may also be processed one at a time as a matter of design choice.

Since for each target row there are two victim rows that must receive a special TRR refresh operation, the row address of each victim row must be determined from the address of the target row. This is preferably done in the bank row decoder 132 in each bank where a simple logic function can be built in to address the neighbors of a target row at particular address. Persons skilled in the art will realize that the victim row address determination can be performed elsewhere in DRAM 100 (e.g., in queue control logic 2002) as a matter of design choice and that all such embodiments fall within the scope of the invention.

Some DRAMs refresh only a single row in each bank during a refresh operation, while others refresh multiple rows. If only a single row is refreshed per refresh command, then two refresh commands are required to process an entry 1006 in TRRQ 172. If multiple rows are refreshed per refresh command, then only a single refresh command is required to process an entry 1006 in TRRQ 172. Either case is within the scope of the present invention.

Once the entry 1006 has been processed (e.g., both victim rows have been refreshed) then the entry 1006 is cleared from TRRQ 172. If there are still active entries (e.g., there were two target rows in the same bank which could not be processed during the same special TRR refresh operation) then queue control logic 1002 informs refresh control logic 116 that another special TRR refresh operation is required and needs to be scheduled.

The calculation in equation 214 in FIG. 2 assumed that two special TRR refreshes are required for processing an entry 1006. Thus if $N_{TRR(max)}=15$ then the overhead is 30 special TRR refreshes per 8,192 regular refreshes resulting in a 0.4% increase in the frequency of required refresh commands. If only a single special TRR refresh command is needed for an entry 1006, then the overhead drops to 0.2% for the exemplary embodiment of DRAM 100.

Figure 11:
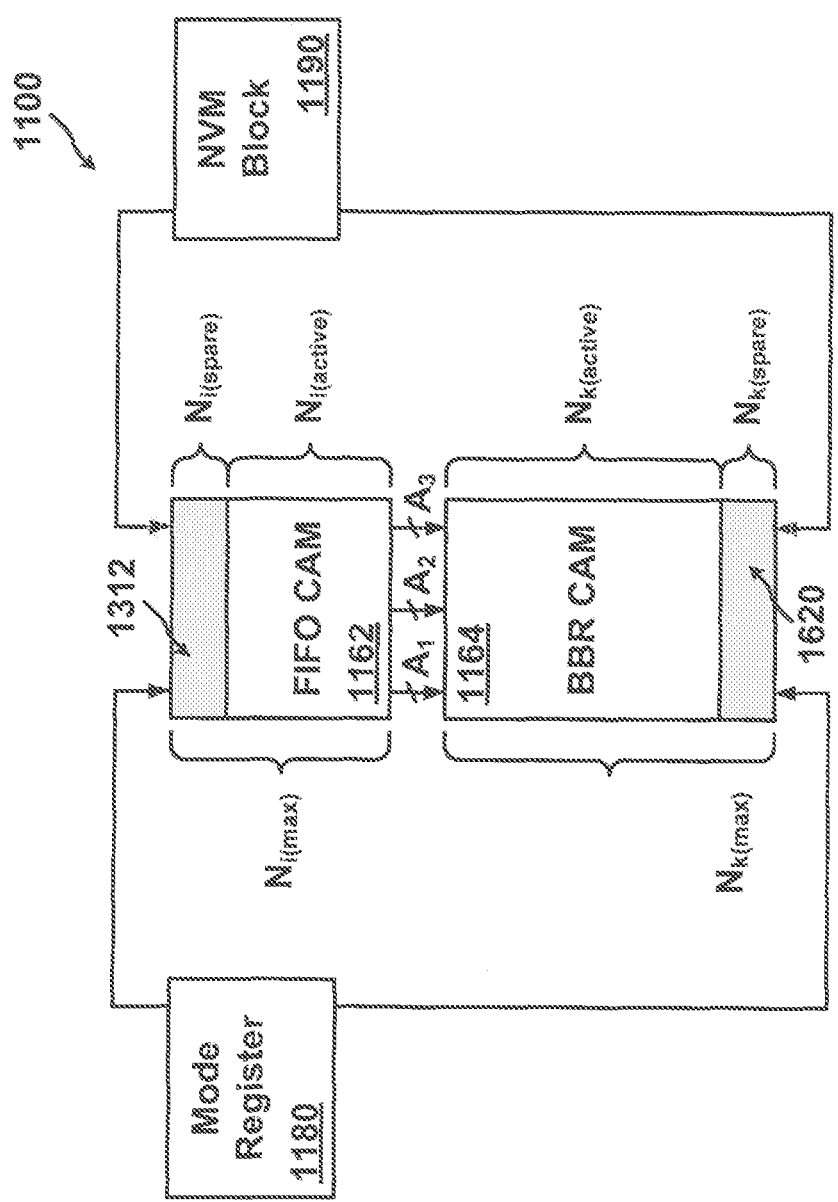
FIG. 11 illustrates the allocation of rows in a FIFO CAM and a BBR CAM according to an embodiment of the present invention.

Turning now to FIG. 11, shows an abstract view of DRAM integrated circuit 1100, an exemplary embodiment of the present invention comprising a modified FIFO CAM 1162 and modified BBR CAM 1164. FIFO CAM 1162 is shown coupled to BBR CAM 1164 and both function substantially as do their counterparts FIFO CAM 162 and BBR CAM 164 in the exemplary embodiment DRAM integrated circuit 100 of FIG. 1. FIFO CAM 1162 comprises a number ($N_{i(max)}$) of address entries 1312, and BBR CAM 164 comprises a number ($N_{k(max)}$) of rows 1620.

FIFO CAM 1162 comprises two regions. The $N_{i(active)}$ region and the shaded $N_{i(spare)}$ region. $N_{i(active)}=N_i$ in a particular application. The presence of $N_{i(spare)}$ allows the value of $N_i$ to be tuned for that application by allowing the number of rows 1312 to be selected from a range of values rather than $N_i$ being a fixed value for all applications. The size of $N_{i(max)}$ is a matter of design choice.

Similarly, BBR CAM 1164 comprises two regions. The $N_{k(active)}$ region and the shaded $N_{k(spare)}$ region. $N_{k(active)}=N_k$ in a particular application. The presence of $N_{k(spare)}$ allows the value of $N_k$ to be tuned for that application by allowing the number of rows 1620 to be selected from a range of values rather than $N_k$ being a fixed value for all applications. The size of $N_{k(max)}$ is a matter of design choice.

DRAM 1100 further comprises a modified mode register 1180 and modified NVM block 1190 and both function substantially as do their counterparts mode register 180 and NVM block 190 in the exemplary embodiment DRAM integrated circuit 100 of FIG. 10. The sizes of $N_{i(active)}$ and $N_{k(active)}$ may be controlled by mode register 1180 and/or NVM block 1190.

Apparatus and methods are disclosed for an embedded target row refresh (TRR) solution with modest overhead. In operation it is nearly transparent to the user. Except for enablement via the mode register and an increase in the average refresh rate on the order of no more than half of one percent, no further user action need be required. The stream of row addresses accompanying ACTIVE commands is monitored and filtered to only track addresses that occur at a dangerous rate and reject addresses that occur at less than a dangerous rate.

Those of ordinary skill in the art will realize that the above figures, descriptions, and embodiments are exemplary only. Many other embodiments will readily suggest themselves to such skilled persons after reviewing this disclosure. Thus the invention is not to be limited in any way except by the issued claims.

What is claimed is:

1. A method for mitigating data loss in a memory array with addressable rows, wherein each addressable row requires regular refresh operations, wherein each addressable row is physically adjacent to at least one other addressable row, and wherein the memory array is coupled (i) to a decoder further coupled to address inputs, and (ii) to command circuitry further coupled to command inputs, the method comprising:
   (A) monitoring the command inputs to detect row activate commands;
   (B) monitoring the address inputs to detect a sequence of active row addresses, each active row address associated with a row activate command;
   (C) identifying one or more detected row addresses by presenting the sequence of active row addresses to a first filter coupled to the address inputs, the first filter detecting when an active row address occurs at a more frequent rate than a predetermined maximum rate; and
   (D) presenting each detected row address to a second filter coupled to the first filter, wherein:
      (i) upon a first detection of a detected row address that row address is stored in a tracked address memory location, each tracked address memory location being coupled to a first associated counter and a second associated counter, each counter having a stored value,
      (ii) the first associated counter and the second associated counter are both reset when the detected row address is first stored in the tracked address memory location,
      (iii) upon a subsequent detection of the detected row address in the tracked memory address location the first associated counter is incremented, and
      (iv) upon detection of every detected row address the second associated counter is incremented, and
      (v) wherein:
         if the value in any first counter exceeds a first predetermined value,
         then a non-regular data loss mitigation refresh operation is performed for the one or more addressable rows physically adjacent to detected row address stored in the associated tracked memory address location.

2. The method of claim 1,
   wherein the predetermined maximum rate is specified by data stored in one of the group consisting of: (i) a non-volatile memory and (ii) a mode register, and wherein the predetermined maximum number of occurrences is specified by data stored in one of the group consisting of: (i) a non-volatile memory and (ii) a mode register.

3. The method of claim 1, further comprising the step:

(E) resetting the first associated counter and the second associated counter coupled to each tracked address memory location either:

when a non-regular data loss mitigation refresh operation for each row physically adjacent to the detected row address stored in the tracked memory location is performed, or when a regular row refresh operation for each row physically adjacent to the detected row address stored in the tracked memory location is performed.

4. The method of claim 3, wherein the predetermined maximum rate is specified by data stored in one of the group consisting of: (i) a non-volatile memory and (ii) a mode register, and wherein the predetermined maximum number of occurrences is specified by data stored in one of the group consisting of: (i) a non-volatile memory and (ii) a mode register.

5. The method of claim 3, wherein the first filter comprises a first memory:

wherein the first memory further comprises a plurality of first data words, wherein each of the first data words is configured to have an associated match flag, wherein each first data word contains an active row address written in sequence in a first in/first out (FIFO) manner from the sequence of active row addresses presented to the first filter, wherein each match flag is reset when an active row address is written into the associated first data word, wherein the associated match flag is set for each of the first plurality of data words where the contents of the data word match the presented active row address, and wherein the associated match flag is not set for each of the first plurality of data words where the contents of the data word do not match the presented active row address.

6. The method of claim 5, wherein the predetermined maximum rate is specified by data stored in one of the group consisting of: (i) a non-volatile memory and (ii) a mode register, and wherein the predetermined maximum number of occurrences is specified by data stored in one of the group consisting of: (i) a non-volatile memory and (ii) a mode register.

7. The method of claim 5, wherein the second filter comprises a second memory:

wherein the second memory further comprises second data words, each second data word being a tracked address memory location, and wherein each second data word contains a detected row address written into the second memory in a random access manner.

8. The method of claim 7, wherein the predetermined maximum rate is specified by data stored in one of the group consisting of: (i) a non-volatile memory and (ii) a mode register, and wherein the predetermined maximum number of occurrences is specified by data stored in one of the group consisting of: (i) a non-volatile memory and (ii) a mode register.

9. The method of claim 7, further comprising the steps:

(F) selecting one of the plurality of second data words, the selected second data word being eligible to be selected if the stored value of its associated second counter is greater than a second predetermined value;

(G) writing a detected row address into the selected second data word when the detected row address does not match the contents of any of the tracked address memory locations in the plurality of second data words is presented to the second filter;

(H) resetting first counter associated with the selected one of the second data words; and (I) resetting second counter associated with the selected one of the second data words.

10. The method of claim 3, wherein the second filter comprises a second memory:

wherein the second memory further comprises second data words, each second data word being a tracked address memory location, wherein each second data word contains a detected row address written into the second memory in a random access manner.

11. The method of claim 10, wherein the predetermined maximum rate is specified by data stored in one of the group consisting of: (i) a non-volatile memory and (ii) a mode register, and wherein the predetermined maximum number of occurrences is specified by data stored in one of the group consisting of: (i) a non-volatile memory and (ii) a mode register.

12. The method of claim 10, further comprising the steps:

(F) selecting one of the plurality of second data words, the selected second data word being eligible to be selected if the stored value of its associated second counter is greater than a second predetermined value;

(G) writing a detected row address into the selected second data word when the detected row address does not match the contents of any of the tracked address memory locations in the plurality of second data words is presented to the second filter;

(H) resetting first counter associated with the selected one of the second data words; and (I) resetting second counter associated with the selected one of the second data words.

13. The method of claim 1, wherein the first filter comprises a first memory:

wherein the first memory further comprises a plurality of first data words, wherein each of the first data words is configured to have an associated match flag, wherein each first data word contains an active row address written in sequence in a first in/first out (FIFO) manner from the sequence of active row addresses presented to the first filter, and wherein each match flag is reset when an active row address is written into the associated first data word, wherein the associated match flag is set for each of the first plurality of data words where the contents of the data word match the presented active row address, and wherein the associated match flag is not set for each of the first plurality of data words where the contents of the data word do not match the presented active row address.

14. The method of claim 13, wherein the predetermined maximum rate is specified by data stored in one of the group consisting of: (i) a non-volatile memory and (ii) a mode register, and wherein the predetermined maximum number of occurrences is specified by data stored in one of the group consisting of: (i) a non-volatile memory and (ii) a mode register.

15. The method of claim 13, wherein the second filter comprises a second memory:
   wherein the second memory further comprises second data words, each second data word being a tracked address memory location,
   wherein each second data word contains a detected row address written into the second memory in a random access manner.

16. The method of claim 15,
   wherein the predetermined maximum rate is specified by data stored in one of the group consisting of: (i) a non-volatile memory and (ii) a mode register, and
   wherein the predetermined maximum number of occurrences is specified by data stored in one of the group consisting of: (i) a non-volatile memory and (ii) a mode register.

17. The method of claim 15, further comprising the steps:
   (F) selecting one of the plurality of second data words, the selected second data word being eligible to be selected if the stored value of its associated second counter is greater than a second predetermined value;
   (G) writing a detected row address into the selected second data word when the detected row address does not match the contents of any of the tracked address memory locations in the plurality of second data words is presented to the second filter;
   (H) resetting first counter associated with the selected one of the second data words; and
   (I) resetting second counter associated with the selected one of the second data words.

18. The method of claim 1, wherein the second filter comprises a second memory:
   wherein the second memory further comprises second data words, each second data word being a tracked address memory location,
   wherein each second data word contains a detected row address written into the second memory in a random access manner.

19. The method of claim 18,
   wherein the predetermined maximum rate is specified by data stored in one of the group consisting of: (i) a non-volatile memory and (ii) a mode register; and
   wherein the predetermined maximum number of occurrences is specified by data stored in one of the group consisting of: (i) a non-volatile memory and (ii) a mode register.

20. The method of claim 18, further comprising the steps:
   (F) selecting one of the plurality of second data words, the selected second data word being eligible to be selected if the stored value of its associated second counter is greater than a second predetermined value;
   (G) writing a detected row address into the selected second data word when the detected row address does not match the contents of any of the tracked address memory locations in the plurality of second data words is presented to the second filter;
   (H) resetting first counter associated with the selected one of the second data words; and
   (I) resetting second counter associated with the selected one of the second data words.

* * * * *